US011942153B2

(12) United States Patent
Maejima

(10) Patent No.: US 11,942,153 B2
(45) Date of Patent: Mar. 26, 2024

(54) SEMICONDUCTOR MEMORY DEVICE

(71) Applicant: Kioxia Corporation, Tokyo (JP)

(72) Inventor: Hiroshi Maejima, Tokyo (JP)

(73) Assignee: Kioxia Corporation, Tokyo (JP)

( * ) Notice: Subject to any disclaimer, the term of this patent is extended or adjusted under 35 U.S.C. 154(b) by 288 days.

(21) Appl. No.: 17/552,225

(22) Filed: Dec. 15, 2021

(65) Prior Publication Data

US 2022/0351777 A1 Nov. 3, 2022

(30) Foreign Application Priority Data

Apr. 28, 2021 (JP) ................................ 2021-076417

(51) Int. Cl.
*G11C 16/04* (2006.01)
*G11C 7/06* (2006.01)
*G11C 16/08* (2006.01)
*G11C 16/24* (2006.01)
*G11C 16/26* (2006.01)
*G11C 16/30* (2006.01)

(52) U.S. Cl.
CPC ............ *G11C 16/0433* (2013.01); *G11C 7/06* (2013.01); *G11C 16/08* (2013.01); *G11C 16/24* (2013.01); *G11C 16/26* (2013.01); *G11C 16/30* (2013.01)

(58) Field of Classification Search
CPC ....... G11C 16/0433; G11C 7/06; G11C 16/08; G11C 16/24; G11C 16/26; G11C 16/30; G11C 7/12; G11C 8/08; G11C 8/10; G11C 7/08; G11C 16/32; G11C 11/5642; G11C 16/0483
See application file for complete search history.

(56) References Cited

U.S. PATENT DOCUMENTS 10,381,096 B2 8/2019 Maejima et al.
10,797,073 B2 10/2020 Maejima
11,056,190 B2 * 7/2021 Hsu ........................ G11C 16/26
11,169,742 B2 11/2021 Maejima
(Continued)

FOREIGN PATENT DOCUMENTS

JP 2017111847 A 6/2017
JP 2020047320 A 3/2020
JP 2020205387 A 12/2020

OTHER PUBLICATIONS

U.S. Appl. No. 17/472,361, First Named Inventor: Hiroshi Maejima; Title: "Semiconductor Memory Device"; filed Sep. 10, 2021.
(Continued)

*Primary Examiner* — Jerome Leboeuf
(74) *Attorney, Agent, or Firm* — Holtz, Holtz & Volek PC

(57) ABSTRACT

According to one embodiment, a semiconductor memory device includes a first string unit including a first memory string including a first selection transistor and a first memory cell coupled to the first selection transistor, a second string unit including a second memory string including a second selection transistor and a second memory cell coupled to the second selection transistor, a first select gate line, a second select gate line, a first bit line, a second bit line, and a first word line. Both of the first select gate line and the second select gate line are selected in a first read operation. The first select gate line is selected and the second select gate line is not selected in a second read operation.

20 Claims, 30 Drawing Sheets

(56) References Cited

U.S. PATENT DOCUMENTS

| | | | | |
|---|---|---|---|---|
| 2015/0380100 | A1* | 12/2015 | Hosono | G11C 16/0483 365/185.11 |
| 2016/0027504 | A1* | 1/2016 | Lee | G11C 16/14 365/185.03 |
| 2020/0091175 | A1* | 3/2020 | Maejima | H10B 43/10 |
| 2020/0335513 | A1 | 10/2020 | Morozumi et al. | |
| 2020/0402999 | A1 | 12/2020 | Nakaki | |
| 2021/0118862 | A1 | 4/2021 | Maejima et al. | |
| 2021/0158876 | A1 | 5/2021 | Maejima et al. | |

OTHER PUBLICATIONS

U.S. Appl. No. 17/494,015, First Named Inventor: Hiroshi MaejimaTitle: “Memory System, Memory Controller, and Semiconductor Memory Device”; filed Oct. 5, 2021.

* cited by examiner

| | | | BL(4n) | BL(4n+1) | BL(4n+2) | BL(4n+3) | BL(4n) | .... |
|---|---|---|---|---|---|---|---|---|
| | | | n=0 | n=0 | n=0 | n=0 | n=1 | .... |
| | | | BL0 | BL1 | BL2 | BL3 | BL4 | .... |
| SU(4m) | m=0 | SU0 | Coupled | Non-coupled | Coupled | Non-coupled | Coupled | .... |
| SU(4m+1) | m=0 | SU1 | Non-coupled | Non-coupled | Coupled | Coupled | Non-coupled | .... |
| SU(4m+2) | m=0 | SU2 | Non-coupled | Coupled | Non-coupled | Coupled | Non-coupled | .... |
| SU(4m+3) | m=0 | SU3 | Coupled | Coupled | Non-coupled | Non-coupled | Coupled | .... |
| SU(4m) | m=1 | SU4 | Coupled | Non-coupled | Coupled | Non-coupled | Coupled | .... |
| SU(4m+1) | m=1 | SU5 | Non-coupled | Non-coupled | Coupled | Coupled | Non-coupled | .... |
| SU(4m+2) | m=1 | SU6 | Non-coupled | Coupled | Non-coupled | Coupled | Non-coupled | .... |
| SU(4m+3) | m=1 | SU7 | Coupled | Coupled | Non-coupled | Non-coupled | Coupled | .... |

FIG. 3

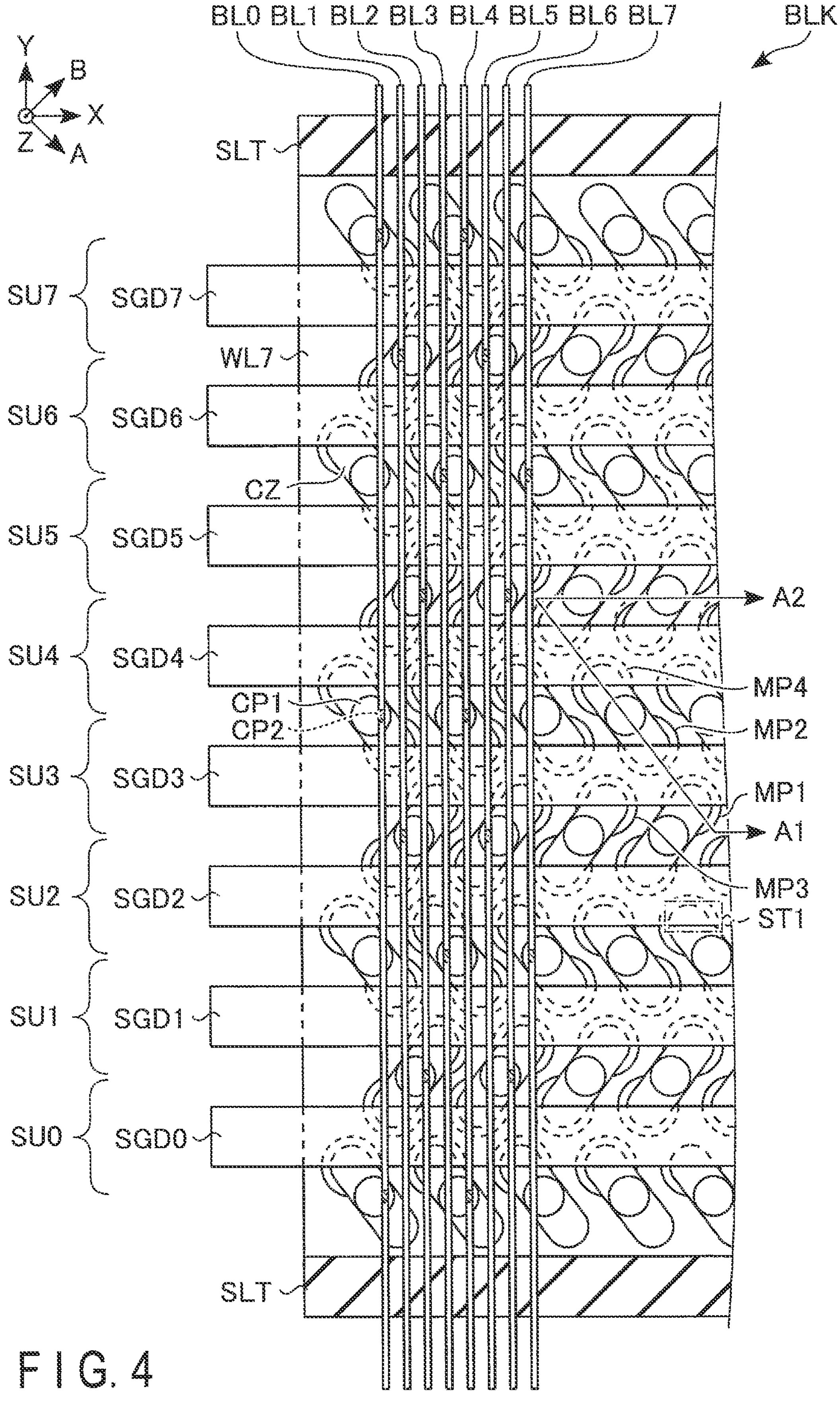
F I G. 4

| | Er | A | B | C | D | E | F | G |
|---|---|---|---|---|---|---|---|---|
| Upper | 1 | 1 | 1 | 0 | 0 | 0 | 0 | 1 |
| Middle | 1 | 1 | 0 | 0 | 1 | 1 | 0 | 0 |
| Lower | 1 | 0 | 0 | 0 | 0 | 1 | 1 | 1 |

| | | | BL selection in 1-SGD selection | | | | |
|---|---|---|---|---|---|---|---|
| | | | BL(4n) | BL(4n+1) | BL(4n+2) | BL(4n+3) | |
| SGDe (SGD(4m) SGD(4m+2)) | m=0 | SGD0 | Selected | Non-selected | Selected | Non-selected | 2SGD selection |
| | | SGD2 | Non-selected | Selected | Non-selected | Selected | |
| | m=1 | SGD4 | Selected | Non-selected | Selected | Non-selected | 2SGD selection |
| | | SGD6 | Non-selected | Selected | Non-selected | Selected | |
| SGDo (SGD(4m+1) SGD(4m+3)) | m=0 | SGD1 | Non-selected | Non-selected | Selected | Selected | 2SGD selection |
| | | SGD3 | Selected | Selected | Non-selected | Non-selected | |
| | m=1 | SGD5 | Non-selected | Non-selected | Selected | Selected | 2SGD selection |
| | | SGD7 | Selected | Selected | Non-selected | Non-selected | |

F I G. 10

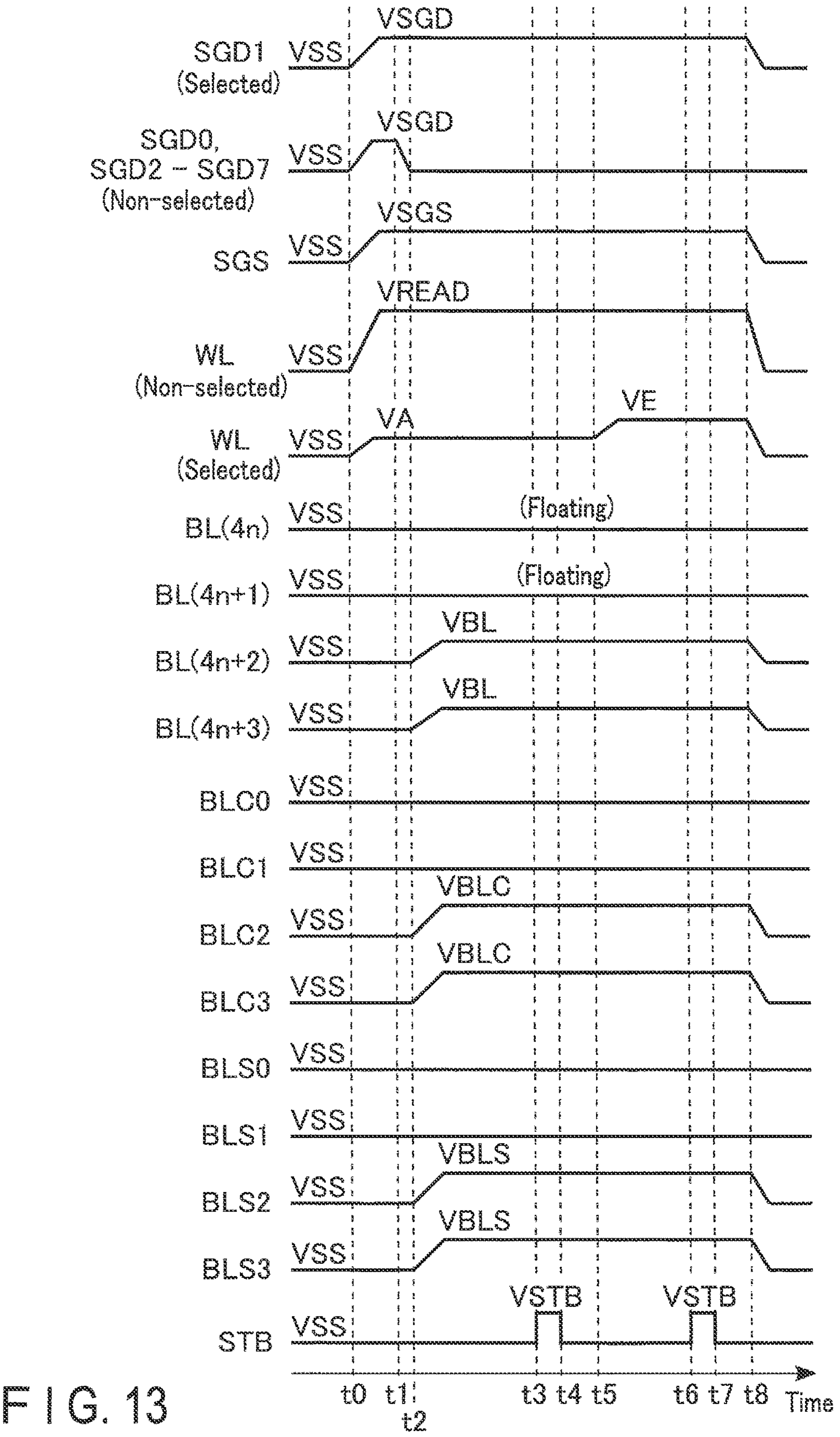
F I G. 13

| | | | BL(4n) | BL(4n+1) | BL(4n+2) | BL(4n+3) | BL(4n) | .... |
|---|---|---|---|---|---|---|---|---|
| | | | n=0 | n=0 | n=0 | n=0 | n=1 | .... |
| | | | BL0 | BL1 | BL2 | BL3 | BL4 | .... |
| SU(4m) | m=0 | SU0 | Coupled | Non-coupled | Coupled | Non-coupled | Coupled | .... |
| SU(4m+1) | m=0 | SU1 | Coupled | Non-coupled | Coupled | Non-coupled | Coupled | .... |
| SU(4m+2) | m=0 | SU2 | Non-coupled | Coupled | Non-coupled | Coupled | Non-coupled | .... |
| SU(4m+3) | m=0 | SU3 | Non-coupled | Coupled | Non-coupled | Coupled | Non-coupled | .... |
| SU(4m) | m=1 | SU4 | Coupled | Non-coupled | Coupled | Non-coupled | Coupled | .... |
| SU(4m+1) | m=1 | SU5 | Coupled | Non-coupled | Coupled | Non-coupled | Coupled | .... |
| SU(4m+2) | m=1 | SU6 | Non-coupled | Coupled | Non-coupled | Coupled | Non-coupled | .... |
| SU(4m+3) | m=1 | SU7 | Non-coupled | Coupled | Non-coupled | Coupled | Non-coupled | .... |

F I G. 17

| | | | BL selection in 1-SGD selection | | | | |
|---|---|---|---|---|---|---|---|
| | | | BL(4n) | BL(4n+1) | BL(4n+2) | BL(4n+3) | |
| SGDe (SGD(4m) SGD(4m+2)) | m=0 | SGD0 | Selected | Non-selected | Selected | Non-selected | 2SGD selection |
| | | SGD2 | Non-selected | Selected | Non-selected | Selected | |
| | m=1 | SGD4 | Selected | Non-selected | Selected | Non-selected | 2SGD selection |
| | | SGD6 | Non-selected | Selected | Non-selected | Selected | |
| SGDo (SGD(4m+1) SGD(4m+3)) | m=0 | SGD1 | Selected | Non-selected | Selected | Non-selected | 2SGD selection |
| | | SGD3 | Non-selected | Selected | Non-selected | Selected | |
| | m=1 | SGD5 | Selected | Non-selected | Selected | Non-selected | 2SGD selection |
| | | SGD7 | Non-selected | Selected | Non-selected | Selected | |

F I G. 19

| | | | BL(4n) | BL(4n+1) | BL(4n+2) | BL(4n+3) | BL(4n) | .... |
|---|---|---|---|---|---|---|---|---|
| | | | n=0 | n=0 | n=0 | n=0 | n=1 | .... |
| | | | BL0 | BL1 | BL2 | BL3 | BL4 | .... |
| SU(4m) | m=0 | SU0 | Non-coupled | Coupled | Coupled | Non-coupled | Non-coupled | .... |
| SU(4m+1) | m=0 | SU1 | Coupled | Non-coupled | Coupled | Non-coupled | Coupled | .... |
| SU(4m+2) | m=0 | SU2 | Coupled | Non-coupled | Non-coupled | Coupled | Coupled | .... |
| SU(4m+3) | m=0 | SU3 | Non-coupled | Coupled | Non-coupled | Coupled | Non-coupled | .... |
| SU(4m) | m=1 | SU4 | Non-coupled | Coupled | Coupled | Non-coupled | Non-coupled | .... |
| SU(4m+1) | m=1 | SU5 | Coupled | Non-coupled | Coupled | Non-coupled | Coupled | .... |
| SU(4m+2) | m=1 | SU6 | Coupled | Non-coupled | Non-coupled | Coupled | Coupled | .... |
| SU(4m+3) | m=1 | SU7 | Non-coupled | Coupled | Non-coupled | Coupled | Non-coupled | .... |

FIG. 22

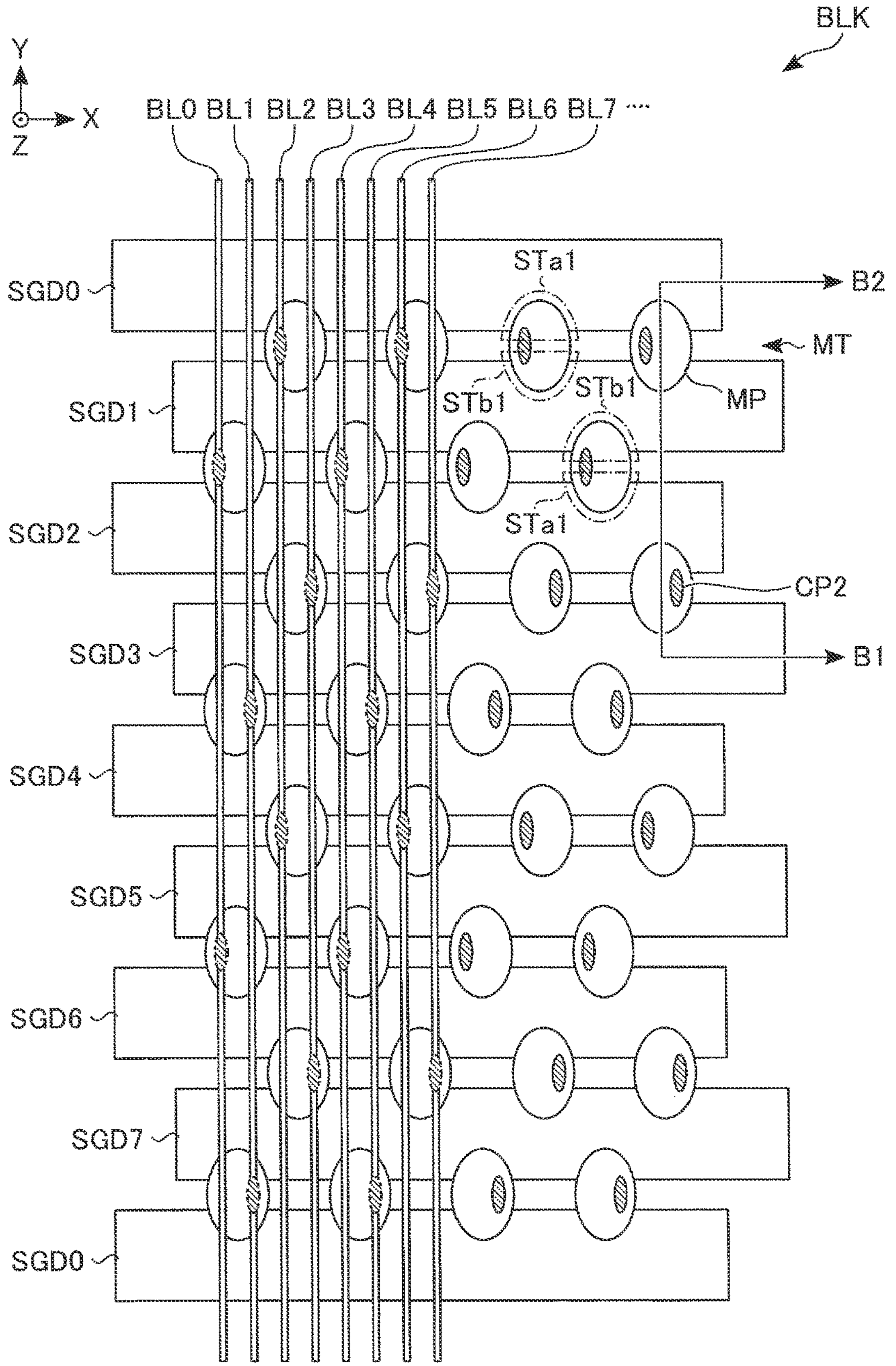
F I G. 23

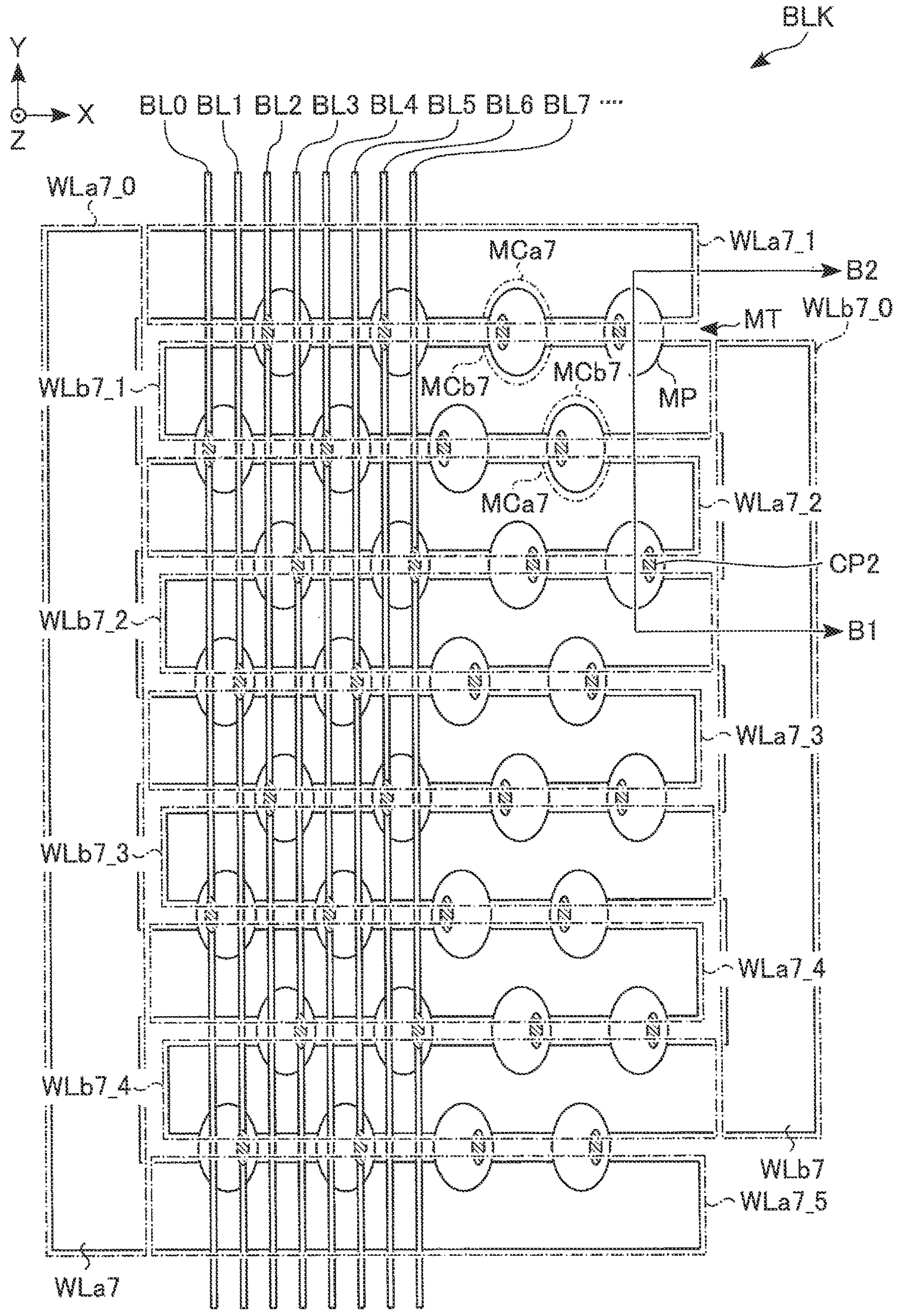
F I G. 24

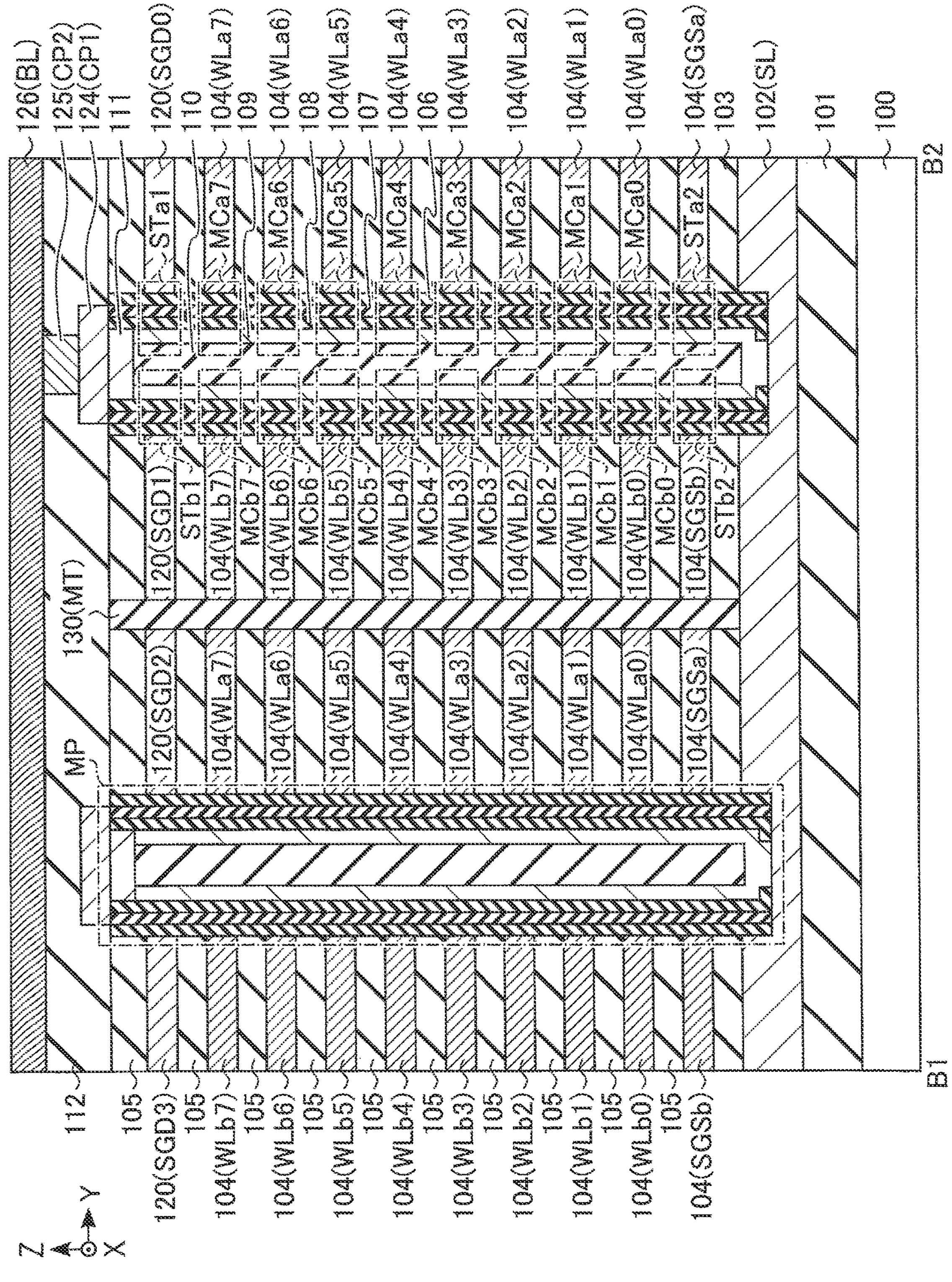
F I G. 25

| | | | BL selection in 1-SGD selection | | | | |
|---|---|---|---|---|---|---|---|
| | | | BL(4n) | BL(4n+1) | BL(4n+2) | BL(4n+3) | |
| SGDe (SGD(4m) SGD(4m+2)) | m=0 | SGD0 | Non-selected | Selected | Selected | Non-selected | 2SGD selection |
| | | SGD2 | Selected | Non-selected | Non-selected | Selected | |
| | m=1 | SGD4 | Non-selected | Selected | Selected | Non-selected | 2SGD selection |
| | | SGD6 | Selected | Non-selected | Non-selected | Selected | |
| SGDo (SGD(4m+1) SGD(4m+3)) | m=0 | SGD1 | Selected | Non-selected | Selected | Non-selected | 2SGD selection |
| | | SGD3 | Non-selected | Selected | Non-selected | Selected | |
| | m=1 | SGD5 | Selected | Non-selected | Selected | Non-selected | 2SGD selection |
| | | SGD7 | Non-selected | Selected | Non-selected | Selected | |

F I G. 26

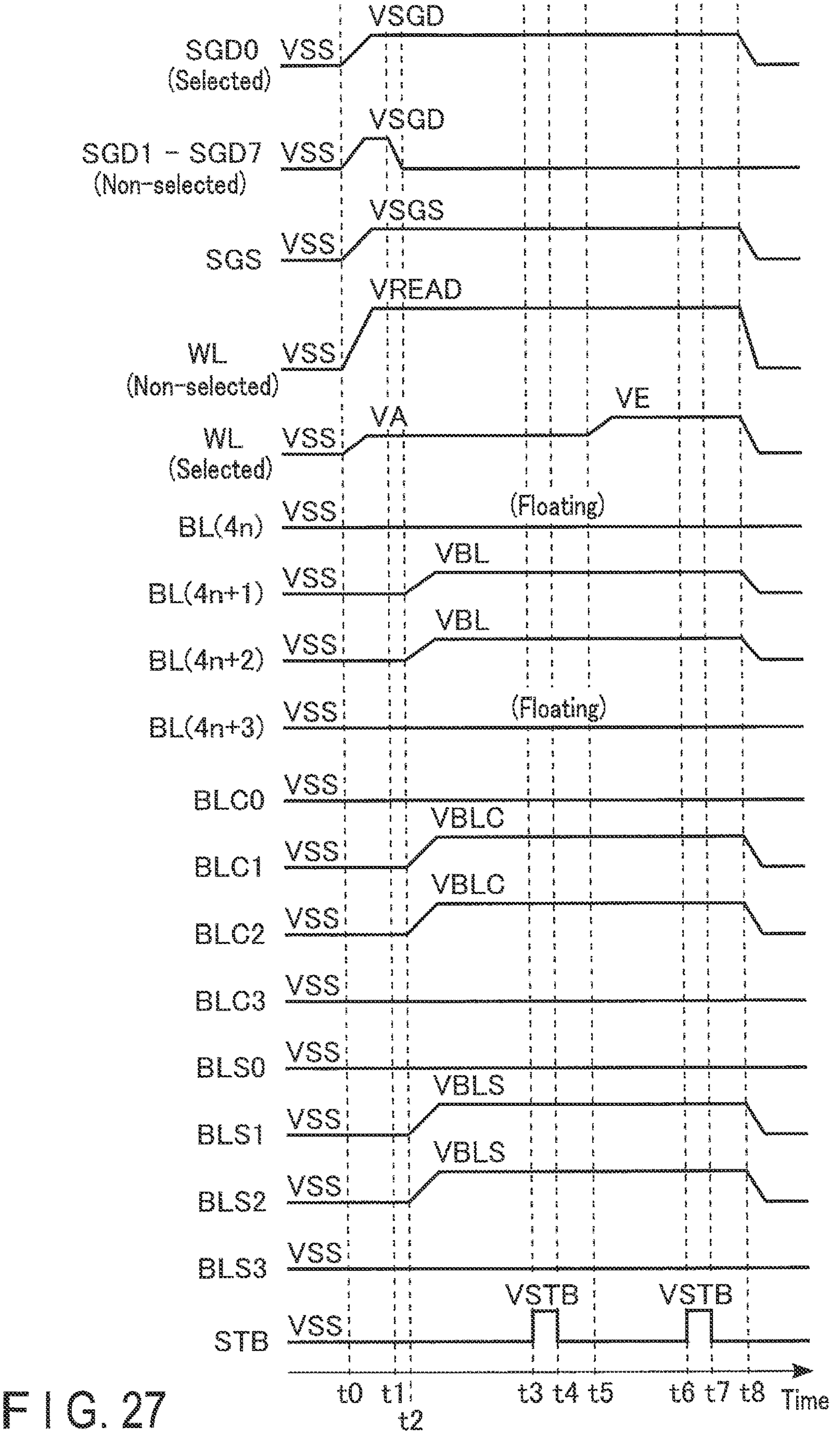
F I G. 27

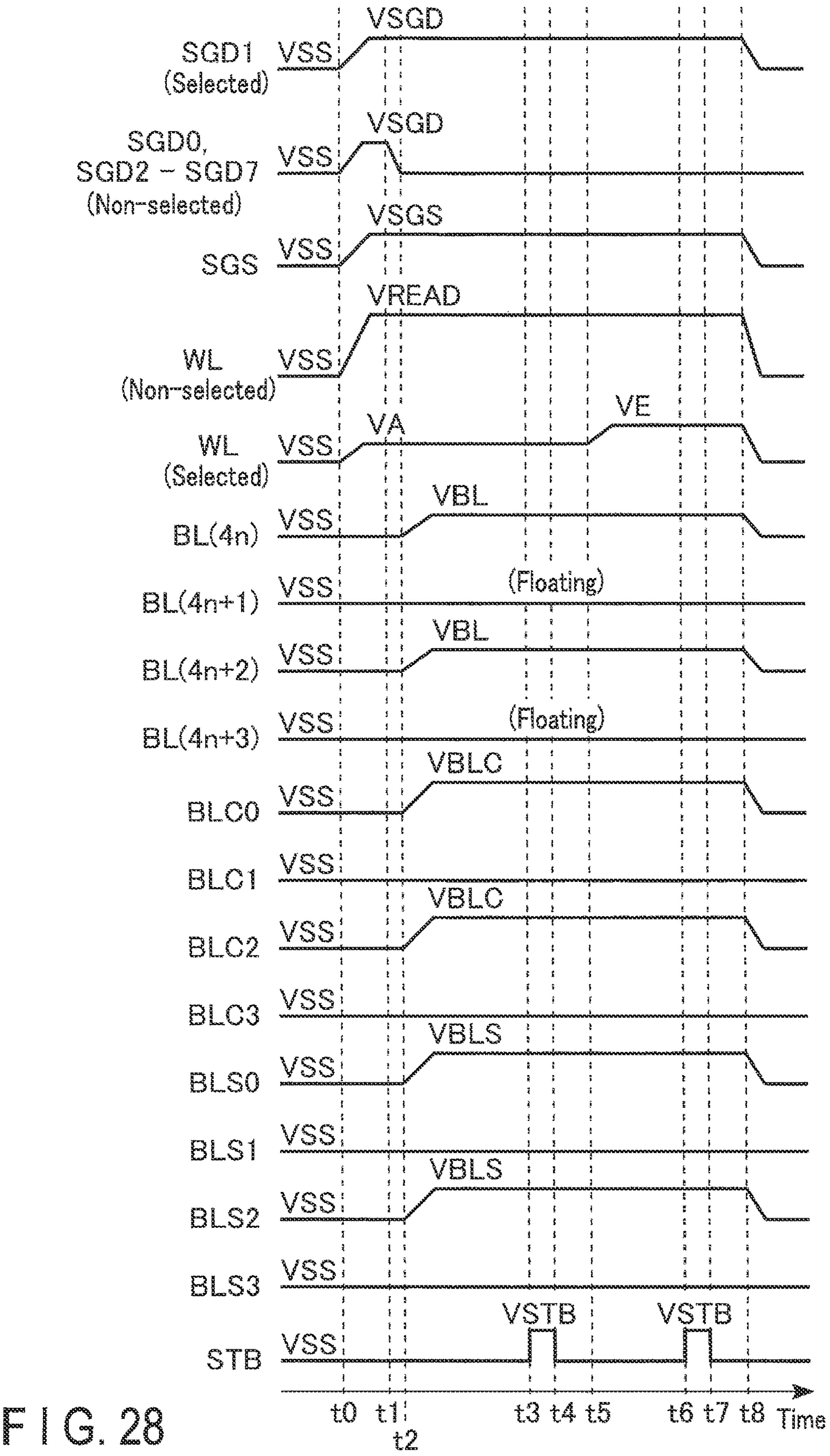
F I G. 28

SEMICONDUCTOR MEMORY DEVICE

CROSS-REFERENCE TO RELATED APPLICATIONS

This application is based upon and claims the benefit of priority from Japanese Patent Application No. 2021-076417, filed Apr. 28, 2021, the entire contents of which are incorporated herein by reference.

FIELD

Embodiments described herein relate generally to a semiconductor memory device.

BACKGROUND

A three-dimensionally stacked type NAND flash memory is known as a semiconductor memory device.

BRIEF DESCRIPTION OF THE DRAWINGS

FIG. 3 is a table showing coupling between string units and bit lines in the memory cell array according to the first embodiment.

FIG. 4 is a plan view of the memory cell array according to the memory cell array according to the first embodiment.

FIG. 10 is a table showing selection of select gate lines and bit lines during 1-SGD selection operation and 2-SGD selection operation according to the first embodiment.

FIG. 13 is a timing chart showing voltages of interconnects during 1-SGD selection read operation according to the first embodiment.

FIG. 17 is a table showing coupling between string units and bit lines in the memory cell array according to the second embodiment.

FIG. 19 is a table showing selection of select gate lines and bit lines during 1-SGD selection operation and 2-SGD selection operation according to the second embodiment.

FIG. 22 is a table showing coupling between string units and bit lines in the memory cell array according to the third embodiment.

FIG. 23 is a plan view of select gate lines SGS in the memory cell array according to the third embodiment.

FIG. 24 is a plan view of word lines in the memory cell array according to the third embodiment.

FIG. 25 is a sectional view of the memory cell array taken along line B1-B2 shown in FIG. 21.

FIG. 26 is a table showing selection of select gate lines and bit lines during 1-SGD selection operation and 2-SGD selection operation according to the third embodiment.

FIG. 27 is a timing chart showing voltages of interconnects during 1-SGD selection read operation according to the third embodiment.

FIG. 28 is a timing chart showing voltages of interconnects during 1-SGD selection read operation according to the third embodiment.

DETAILED DESCRIPTION

Figure 1:
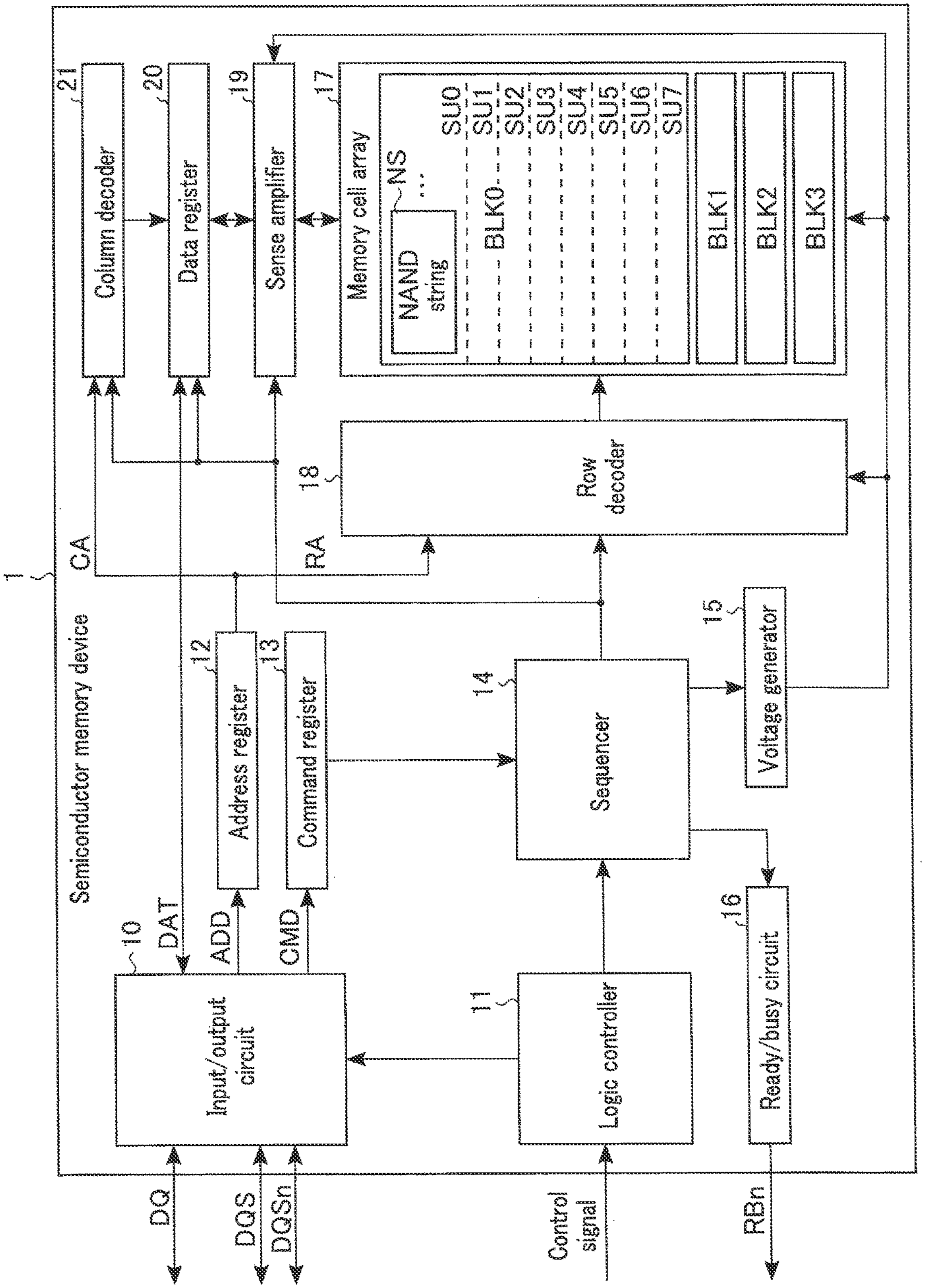
FIG. 1 is a block diagram illustrating a semiconductor memory device according to a first embodiment.

In general, according to one embodiment, a semiconductor memory device includes a first string unit including a first memory string including a first selection transistor and a first memory cell coupled to the first selection transistor; a second string unit including a second memory string including a second selection transistor and a second memory cell coupled to the second selection transistor; a first select gate line that is coupled to the first selection transistor; a second select gate line that is coupled to the second selection transistor and is different from the first select gate line; a first bit line that is coupled to the first string unit and is not coupled to the second string unit; a second bit line that is coupled to the second string unit and is not coupled to the first string unit; and a first word line that is coupled to the first memory cell and the second memory cell. Both of the first select gate line and the second select gate line are selected in a first read operation. The first select gate line is selected and the second select gate line is not selected in a second read operation.

Hereinafter, embodiments will be described with reference to the accompanying drawings. In the following description, constituent elements having substantially the same function and configuration will be assigned the same reference numeral or symbol. Repeat descriptions may be omitted when unnecessary. The embodiments to be described below are described to give examples of apparatuses and methods that realize the technical concepts of the embodiments. The technical concepts of the embodiments do not limit the materials, forms, structures, arrangements, etc. of the structural components to the ones described below. Various modifications may be made to the technical concepts of the embodiments without departing from the spirit of the invention. The embodiments and modifications are included in the scope of the claimed inventions and their equivalents.

1. FIRST EMBODIMENT

A semiconductor memory device according to a first embodiment will be described.

1.1. Configuration

1.1.1 Overall Configuration of Semiconductor Memory Device

First, an example of an overall configuration of a semiconductor memory device will be described with reference to FIG. 1. FIG. 1 is a block diagram showing an example of an overall configuration of the semiconductor memory device. In FIG. 1, some of the couplings between the blocks are indicated by arrows; however, the couplings between the blocks are not limited to those shown in FIG. 1.

As shown in FIG. 1, a semiconductor memory device 1 is, for example, a three-dimensionally stacked type NAND flash memory. In the three-dimensionally stacked type NAND flash memory, nonvolatile memory cell transistors are three-dimensionally arranged on a semiconductor substrate.

The semiconductor memory device 1 is coupled to a controller (not shown) externally provided. The semiconductor memory device 1 operates based on an order from the controller. The semiconductor memory device 1 transmits and receives a signal DQ and clock signals DQS and DQSn to and from the controller. Examples of the signal DQ include data DAT, an address ADD, and a command CMD. The clock signals DQS and DQSn are clock signals that are used when the data DAT is input and output. The clock signal DQSn is an inversion signal of the signal DQS. The semiconductor memory device 1 receives various control signals from the controller. The semiconductor memory device 1 transmits a ready/busy signal RBn to the controller. The ready/busy signal RBn indicates whether the semiconductor memory device 1 is in a busy state or a ready state. The busy state is a state in which the semiconductor memory device 1 cannot receive the signal DQ from the controller. The ready state is a state in which the semiconductor memory device 1 can receive the signal DQ from the controller.

Next, an internal configuration of the semiconductor memory device 1 will be described. The semiconductor memory device 1 includes an input/output circuit 10, a logic controller 11, an address register 12, a command register 13, a sequencer 14, a voltage generator 15, a ready/busy circuit 16, a memory cell array 17, a row decoder 18, a sense amplifier 19, a data register 20, and a column decoder 21.

The input/output circuit 10 is a circuit that inputs and outputs the signal DQ. The input/output circuit 10 is coupled to the controller. The input/output circuit 10 is coupled to the address register 12, the command register 13, and the data register 20. In the case of the signal DQ being the data DAT, the input/output circuit 10 receives the signal DQ based on the clock signals DQS and DQSn. The input/output circuit 10 transmits the data DAT to the data register 20. The input/output circuit 10 outputs the data DAT along with the clock signals DQS and DQSn to the controller. In the case of the signal DQ being the address ADD, the input/output circuit 10 transmits the address ADD to the address register 12. In the case of the signal DQ being the command CMD, the input/output circuit 10 transmits the command CMD to the command register 13.

The logic controller 11 is a circuit that performs logic control based on the control signals. The logic controller 11 is coupled to the controller. The logic controller 11 is further coupled to the input/output circuit 10 and the sequencer 14. The logic controller 11 receives various control signals from the controller. The logic controller 11 controls the input/output circuit 10 and the sequencer 14 based on the received control signals.

The address register 12 is a register that temporarily stores the address ADD. The address register 12 is coupled to the row decoder 18 and the column decoder 21. The address ADD includes a row address RA and a column address CA. The address register 12 transfers the row address RA to the row decoder 18. The address register 12 transfers the column address CA to the column decoder 21.

The command register 13 is a register that temporarily stores the command CMD. The command register 13 is coupled to the sequencer 14. The command register 13 transfers the command CMD to the sequencer 14.

The sequencer 14 is a circuit that controls the semiconductor memory device 1. The sequencer 14 controls the overall operation of the semiconductor memory device 1. More specifically, the sequencer 14 controls the voltage generator 15, the ready/busy circuit 16, the row decoder 18, the sense amplifier 19, the data register 20, the column decoder 21, etc. The sequencer 14 executes a write operation, a read operation, and an erase operation based on the command CMD.

The voltage generator 15 generates voltages to be used for the write operation, the read operation, and the erase operation. The voltage generator 15 is coupled to the memory cell array 17, the row decoder 18, the sense amplifier 19, etc. For example, the voltage generator 15 supplies voltages to the memory cell array 17, the row decoder 18, and the sense amplifier 19.

The ready/busy circuit 16 is a circuit that transmits a ready/busy signal RBn. The ready/busy circuit 16 transmits the ready/busy signal RBn to the controller in accordance with an operation status of the sequencer 14.

The memory cell array 17 is a set of aligned memory cell transistors. The memory cell array 17 includes a plurality of blocks ELK. In the example shown in FIG. 1, the memory cell array 17 contains blocks BLK0, BLK1, BLK2, and BLK3. The block BLK is, for example, a set of memory cell transistors data of which is erased in batch. The plurality of memory cell transistors in the block BLK are respectively associated with rows and columns. Each of the blocks BLK includes a plurality of string units SU. In the example shown in FIG. 1, the block BLK includes eight string units, SU0, SU1, SU2, SU3, SU4, SU5, SU6, and SU7. The string unit SU is, for example, a set of NAND strings NS which are selected in batch during the write operation or the read operation. The string unit SU includes a plurality of NAND strings NS. Each of the NAND strings NS includes a set of memory cell transistors coupled in series. The number of blocks BLK in the memory cell array 17 and the number of string units SU in each of the blocks BLK are freely selected. The memory cell array 17 will be described in detail later.

The row decoder 18 is a circuit that decodes the row address RA. The row decoder 18 is coupled to the memory cell array 17. The row decoder 18 receives the row address RA from the address register 12. The row decoder 18 selects one of the blocks BLK in the memory cell array 17 based on a result of decoding the row address RA. The row decoder 18 supplies voltages to interconnects (word lines and select gate lines) in the row direction of the selected block BLK.

The sense amplifier 19 is a circuit that writes and reads the data DAT. The sense amplifier 19 is coupled to the memory cell array 17. The sense amplifier 19 reads the data DAT from the memory cell array 17 during the read operation. The sense amplifier 19 supplies voltages corresponding to the write data DAT to the memory cell array 17 during the write operation.

The data register 20 is a register that temporarily stores the data DAT. The data register 20 is coupled to the sense amplifier 19. The data register 20 includes a plurality of latch circuits. Each of the latch circuits temporarily stores the write data DAT or the read data DAT.

The column decoder 21 is a circuit that decodes the column address CA. The column decoder 21 receives the column address CA from the address register 12. The column decoder 21 selects latch circuits in the data register 20 based on a result of decoding the column address CA.

1.1.2 Circuit Configuration of Memory Cell Array

Figure 2:
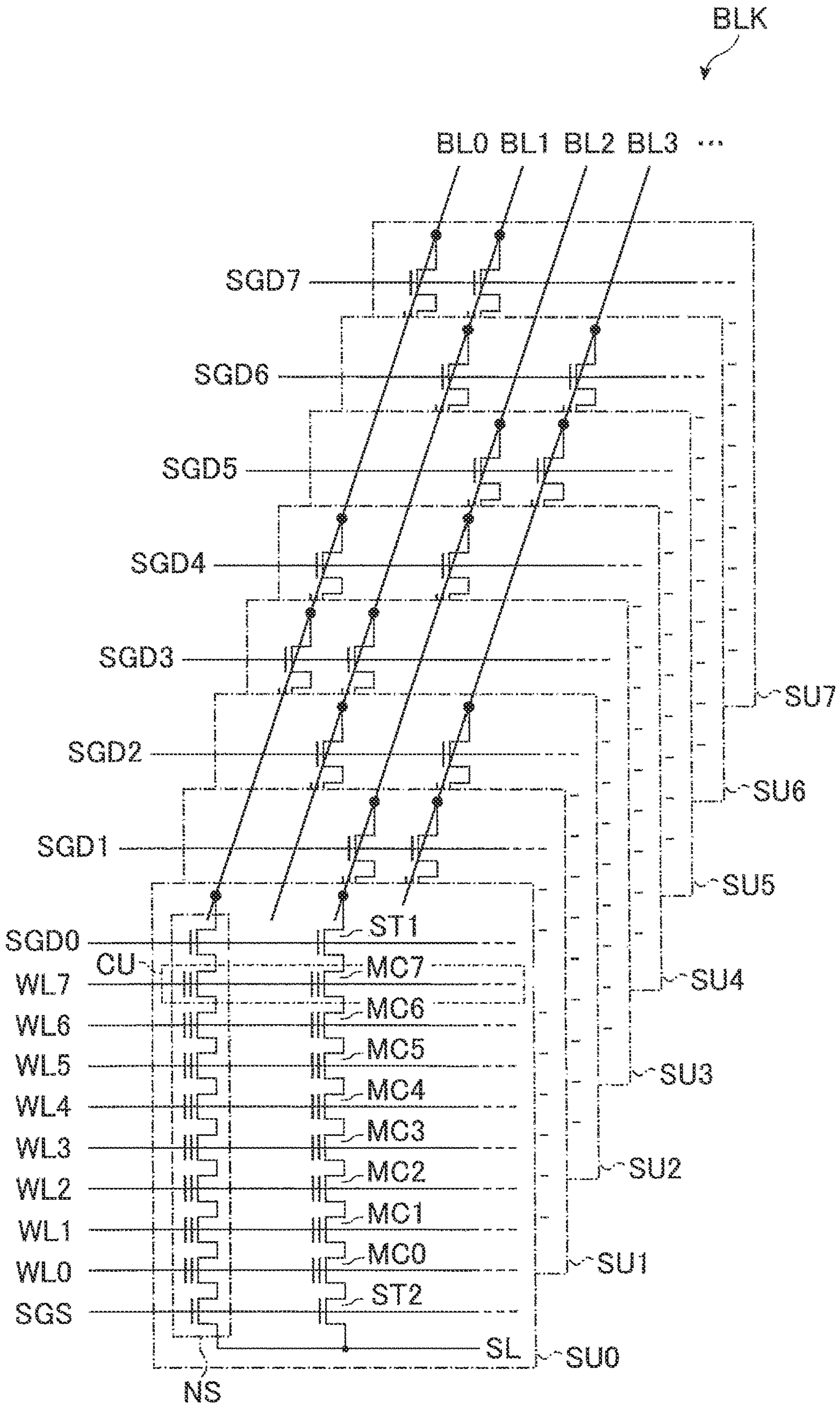
FIG. 2 is a circuit diagram of a memory cell array according to the first embodiment.

Next, an example of a circuit configuration of the memory cell array 17 will be described with reference to FIG. 2. FIG. 2 shows a portion of the circuit configuration of a single block BLK.

As shown in FIG. 2, for example, the plurality of NAND strings NS in the same string unit SU are respectively coupled to different bit lines BL. The bit line BL to which the NAND string NS is coupled is different for each string unit SU. A respective one of the bit lines BL is coupled to one of the NAND strings NS in each of the several string units SU in the string units SU. For example, the bit line BL0 is coupled to the NAND strings NS respectively contained in the string units SU0, SU3, SU4, and SU7. The bit line BL1 is coupled to the NAND strings NS respectively contained in the string units SU2, SU3, SU6, and SU7. The bit line BL2 is coupled to the NAND strings NS respectively contained in the string units SU0, SU1, SU4, and SU5. The bit line BL3 is coupled to the NAND strings NS respectively contained in the string units SU1, SU2, SU5, and SU6.

Next, the internal configuration of each NAND string NS will be described.

Each NAND string NS includes, for example, a plurality of memory cell transistors MC and selection transistors ST1 and ST2. In the example shown in FIG. 2, each NAND string NS includes eight memory string, MC0 to MC7. The number of memory cell transistors MC in each NAND string NS is freely selected.

Each of the memory cell transistors MC nonvolatilely stores data. Each of the memory cell transistors MC includes a control gate and a charge storage layer. Each of the memory cell transistors MC may be of a metal-oxide-nitride-oxide-silicon (MONOS) type or may be of a floating gate (FG) type. The MONOS type uses an insulating layer as a charge storage layer. The FG type uses a conductive layer as a charge storage layer. Hereinafter, the case in which the memory cell transistors MC are of the MONOS type will be described.

The selection transistors ST1 and ST2 are used to select a string unit SU during various operations. The number of selection transistors ST1 and ST2 is freely selected. It suffices that each NAND string NS contains one or more selection transistors ST1 and one or more selection transistors ST2.

In each NAND string NS, the current paths of the memory cell transistors MC and the selection transistors ST1 and ST2 are coupled in series. In the example shown in FIG. 2, the current paths of the selection transistor ST2, the memory cell transistors MC0, MC1, MC2, MC3, MC4, MC5, MC6, and MC7, and the selection transistor ST1 are coupled in series in order from the lower side to the upper side of the drawing sheet. A drain of the selection transistor ST1 is coupled to one of the bit lines BL. A source of the selection transistor ST2 is coupled to a source line SL.

The memory cell transistors MC0 to MC7 included in the same block BLK have their control gates coupled to word lines WL0 to WL7, respectively. More specifically, for example, the block BLK includes seven string units, SU0 to SU7. Each of the string units SU0 to SU7 includes the plurality of memory cell transistors MC0. The plurality of memory cell transistors MC0 included in the same block BLK have their control gates coupled in common to the single word line WL0. The same applies to the memory cell transistors MC1 to MC7.

The plurality of selection transistors ST1 in each string unit SU have their gates coupled in common to the single select gate line SGD. More specifically, the string unit SU0 contains the plurality of selection transistors ST1. The plurality of selection transistors ST1 in the string unit SU0 have their gates coupled in common to the select gate line SGD0. Similarly, the plurality of selection transistors ST1 in the string unit SU1 have their gates coupled in common to the select gate line SGD1. The plurality of selection transistors ST1 in the string unit SU2 have their gates coupled in common to the select gate line SGD2. The plurality of selection transistors ST1 in the string unit SU3 have their gates coupled in common to the select gate line SGD3. The plurality of selection transistors ST1 in the string unit SU4 have their gates coupled in common to the select gate line SGD4. The plurality of selection transistors ST1 in the string unit SU5 have their gates coupled in common to the select gate line SGD5. The plurality of selection transistors ST1 in the string unit SU6 have their gates coupled in common to the select gate line SGD6. The plurality of selection transistors ST1 in the string unit SU7 have their gates coupled in common to the select gate line SGD7.

The plurality of selection transistors ST2 in the same block BLK have their gates coupled in common to a single select gate line SGS. More specifically, for example, each of the string units SU0 to SU7 includes the plurality of selection transistors ST2. These selection transistors ST2 included in each of the blocks BLK have their gates coupled in common to the single select gate line SGS. The select gate line SGS may be provided for each string unit SU.

The word lines WL0 to WL7, the select gate lines SGD0 to SGD7, and the select gate line SGS are each coupled to the row decoder 18.

Each of the bit lines BL is coupled to the sense amplifier 19.

The source line SL is shared among, for example, the plurality of blocks ELK.

Hereinafter, a set of memory cell transistors MC coupled to a single word line WL in a single string unit SU will be referred to as a "cell unit CU". For example, in the case where the each memory cell transistor MC stores 1-bit data, a storage capacity of the cell unit CU will be defined as "1-page data". The cell unit CU may have a storage capacity of 2-page data or more in accordance with the number of bits stored in each memory cell transistor MC.

1.1.3 Coupling Between String Unit and Bit Line

Next, one example of coupling between each string unit SU and each bit line BL will be described with reference to FIG. 3. FIG. 3 is a table showing a coupling relationship between the string units SU and the bit lines BL. In the following description, in the case where one of the NAND strings NS in one string unit SU is coupled to a bit line BL, the string unit SU and the bit line BL are defined as being coupled to each other.

As shown in FIG. 3, with respect to four string units SU, coupling and decoupling are periodically repeated for each set of four bit lines BL.

For example, four string units SU that form a group will be referred to, by using variable m (m is equal to 1 or 2), as SU(4$m$), SU(4$m$+1), SU(4$m$+2), and SU(4$m$+3). For example, in the case of m=0, SU(4$m$)=SU0, SU(4$m$+1)=SU1, SU(4$m$+2)=SU2, and SU(4$m$+3)=SU3. In the case of m=1, SU(4$m$)=SU4, SU(4$m$+1)=SU5, SU(4$m$+2)=SU6, and SU(4$m$+3)=SU7.

Four bit lines BL that form a group will be referred to, by using variable n (n is an integer greater than or equal to 0), as BL(4$n$), BL(4$n$+1), BL(4$n$+2), and BL(4$n$+3). For example, in the case of n=0, BL(4$n$)=BL0, BL(4$n$+1)=BL1, BL(4$n$+2)=BL2, and BL(4$n$+3)=BL3. For example, in the case of n=1, BL(4$n$)=BL4, BL(4$n$+1)=BL5, BL(4$n$+2)=BL6, and BL(4$n$+3)=BL7.

The string unit SU(4$m$) is coupled to the bit lines BL(4$n$) and BL(4$n$+2). The string unit SU(4$m$) is decoupled from the bit lines BL(4$n$+1) and BL(4$n$+3). In the example shown in FIG. 3, the string units SU0 and SU4 are coupled to the bit lines BL0, BL2, BL4. The string units SU0 and SU4 are decoupled from the bit lines BL1 and BL3. That is, the string units SU0 and SU4 are coupled to the even-numbered bit lines BL.

The string unit SU(4$m$+1) is coupled to the bit lines BL(4$n$+2) and BL(4$n$+3). The string unit SU(4$m$+1) is decoupled from the bit lines BL(4$n$) and BL(4$n$+1). In the example shown in FIG. 3, the string units SU1 and SU5 are coupled to the bit lines BL2 and BL3. The string units SU1 and SU5 are decoupled from the bit lines BL0, BL1, and BL4. That is, decoupling and coupling are periodically repeated for each set of two bit lines BL, in correspondence with the string units SU1 and SU5.

The string unit SU(4$m$+2) is coupled to the bit lines BL(4$n$+1) and BL(4$n$+3). The string unit SU(4$m$+2) is decoupled from the bit lines BL(4$n$) and BL(4$n$+2). In the example shown in FIG. 3, the string units SU2 and SU6 are coupled to the bit lines BL1 and BL3. The string units SU2 and SU6 are decoupled from the bit lines BL0, BL2, and BL4. That is, the string units SU2 and SU6 are coupled to the odd-numbered bit lines BL.

The string unit SU(4$m$+3) is coupled to the bit lines BL(4$n$) and BL(4$n$+1). The string unit SU(4$m$+3) is decoupled from the bit lines BL(4$n$+2) and BL(4$n$+3). In the example shown in FIG. 3, the string units SU3 and SU7 are coupled to the bit lines BL0, BL1, and BL4. The string units SU3 and SU7 are decoupled from the bit lines BL2 and BL3. That is, coupling and decoupling are periodically repeated for each set of two bit lines BL, in correspondence with the string units SU3 and SU7.

1.1.4 Planar Configuration of Memory Cell Array

Next, an example of a planer configuration of memory cell array 17 will be described with reference to FIG. 4. FIG. 4 shows a plan view of a partial region of the memory cell array 17. In the example shown in FIG. 4, some of the insulating layers are omitted in order to simplify the description. Furthermore, the bit lines BL other than the bit lines BL0 to BL7 are omitted.

In the following description, an X direction is substantially parallel to the semiconductor substrate and corresponds to the direction in which the word lines WL extend. A Y direction is substantially parallel to the semiconductor substrate and is orthogonal to the X direction. The Y direction corresponds to the direction in which bit lines BL extend. A Z direction is substantially perpendicular to the semiconductor substrate and corresponds to the direction that intersects the X direction and the Y direction. Furthermore, for example, in the XY plane substantially parallel to the semiconductor substrate, a direction that connects between a center of a memory pillar MP1 to be described later and a center of a memory pillar MP2 to be described later will be referred to as an A direction. The A direction is substantially parallel to the semiconductor substrate and corresponds to the direction that differs from the X direction and the Y direction. The direction substantially parallel to the semiconductor substrate and orthogonal to the A direction will be referred to as a B direction.

As shown in FIG. 4, two side surfaces that face the Y direction of the word lines WL extending in the X direction are provided with slits SLT extending in the X direction and the Z direction. In the present embodiment, the select gate line SGS and the word lines WL0 to WL7 are sequentially stacked above the semiconductor substrate. The slits SLT are provided in such a manner as to separate the select gate line SGS and the word lines WL for each block BLK.

For example, the string units SU0 to SU7 are arranged in the Y direction. A plurality of memory pillars MP are provided for each string unit SU.

Each memory pillar MP is a pillar that forms a NAND string NS. The memory pillars MP correspond to the memory cell transistors MC0 to MC7 and the selection transistor ST2 in each NAND string NS. The memory pillars MP penetrate (pass through) the select gate line SGS and the word lines WL0 to WL7. The memory pillars MP extend in the Z direction. The configuration of the memory pillars MP will be described later in detail.

In the example shown in FIG. 4, the plurality of memory pillars MP in each string unit SU are arranged in two rows and in a staggered fashion in the X direction. For example, the string unit SU3 includes the memory pillars MP1, MP2, and MP3. The memory pillar MP1 and the memory pillar MP3 are arranged adjacent to each other in the X direction. The memory pillar MP2 is arranged between the memory pillar MP1 and the memory pillar MP3 in the X direction. The memory pillar MP2 is arranged in a different position from those of the memory pillar MP1 and MP3 in the Y direction. In other words, the memory pillar MP2 is arranged adjacent to the memory pillar MP1 in the A direction. The memory pillar MP2 is arranged adjacent to the memory pillar MP3 in the B direction.

The arrangement of memory pillars MP is freely selectable. For example, the memory pillars MP may be arranged in four rows and in a staggered fashion. Furthermore, the memory pillars MP may not be arranged in a staggered fashion.

The select gate line SGD is provided above the plurality of memory pillars MP that are arranged in two rows and in a staggered fashion in each string unit SU. The select gate lines SGD extend in the X direction. For example, the select gate line SGD3 passes above portions of the memory pillars MP1 to MP3. In other words, portions of the memory pillars MP1 to MP3 are arranged below the select gate line SGD3. A center position of the select gate line SGD3 in the Y direction is positioned between a center position of each of the memory pillars MP1 and MP3 and a center position of the memory pillar MP2.

Between the adjacent string units SU, two memory pillars MP that are adjacent to each other in the A direction or the B direction are coupled to each other via a coupling portion CZ. The selection transistor ST1 is provided on each of the memory pillars MP. A portion of the coupling portion CZ functions as a channel layer of the selection transistor ST1. The configuration of the selection transistor ST1 will be described later in detail. The plurality of selection transistors ST1 in each string unit SU have their gates coupled in common to the corresponding select gate line SGD. For example, in the string unit SU3, the selection transistors ST1 respectively provided on the memory pillars MP1 to MP3 are coupled in common to the select gate line SGD3.

A contact plug CP1 is provided on the coupling portion CZ. In other words, two memory pillars MP that are provided between two select gate lines SGD and that are adjacent to each other in the A direction or the B direction are coupled in common to the single contact plug CP1. For example, the memory pillar MP2 in the string unit SU3 and the memory pillar MP4 in the string unit SU4, which is adjacent to the memory pillar MP2 in the A direction, are coupled to the single contact plug CP1.

The contact plug CP2 is provided on the contact plug CP1. A contact plug CP2 couples one of the bit lines BL extending in the Y direction to the contact plug CP1. The plurality of memory pillars MP in each string unit SU are respectively coupled to the different bit lines BL via the contact plugs CP1 and CP2. For example, the memory pillars MP1 to MP3 are respectively coupled to the different bit lines BL.

1.1.5 Cross-Sectional Configuration of Memory Cell Array

Figure 5:
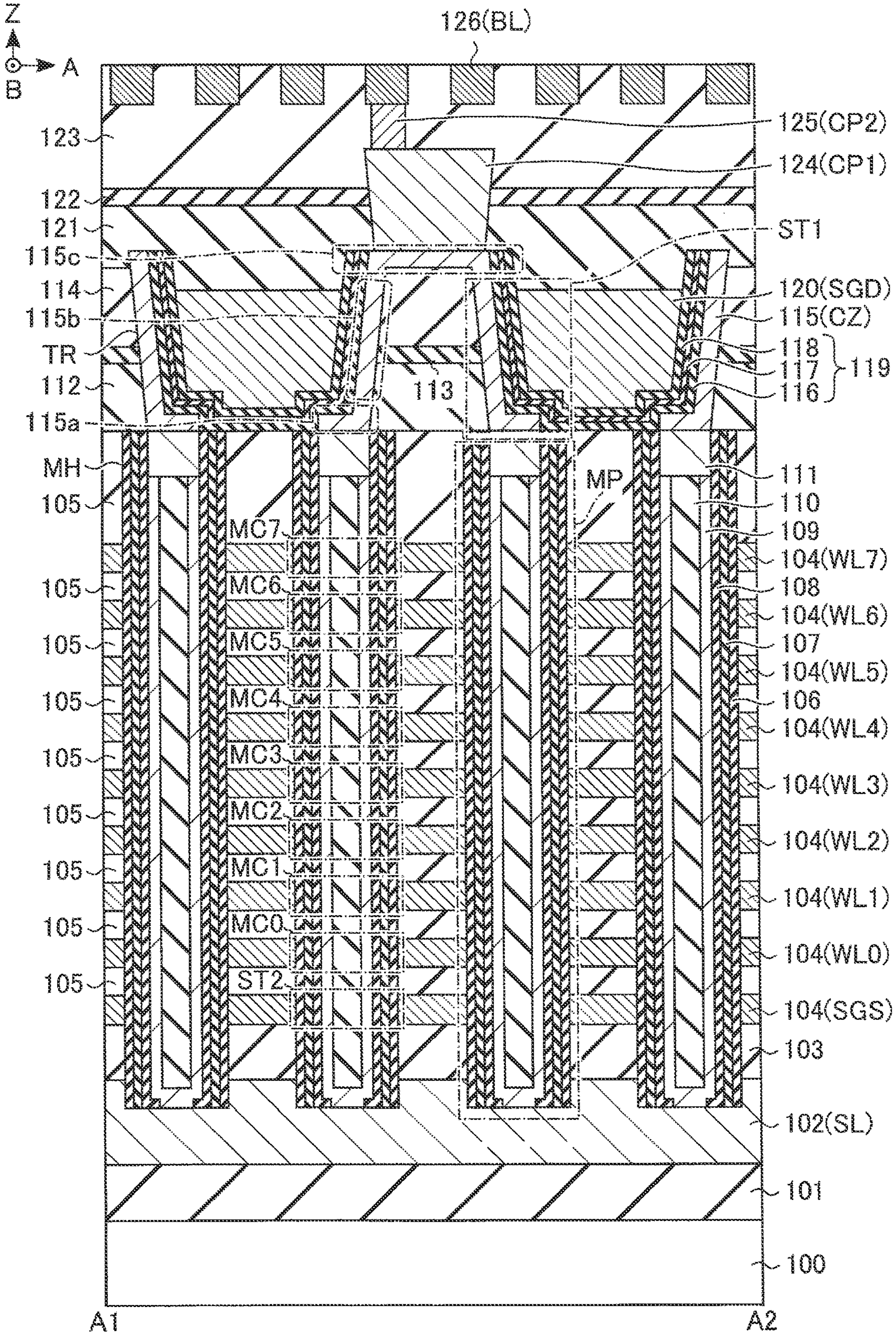
FIG. 5 is a sectional view of the memory cell array taken along line A1-A2 shown in FIG. 4.

Next, an example of a cross-sectional configuration of the memory cell array 17 will be described with reference to FIG. 5. FIG. 5 is a cross-sectional view taken along line A1 to A2 of FIG. 4.

As shown in FIG. 5, an insulating layer 101 is provided on a semiconductor substrate 100. An interconnect layer 102 is provided on the insulating layer 101. For the insulating layer 101, for example, silicon oxide (SiO) containing oxygen and silicon is used. A circuit such as the row decoder 18, the sense amplifier 19, etc. may be provided in a region provided with the insulating layer 101, in other words, between the semiconductor substrate 100 and the interconnect layer 102.

The interconnect layer 102 extends in each of the X direction and the Y direction. The interconnect layer 102 functions as a source line SL. The interconnect layer 102 includes a conductive material. For the conductive material, for example, a metal material or an n-type semiconductor is used. The n-type semiconductor includes, for example, impurities such as phosphorus (P), arsenic (As), etc.

An insulating layer 103 is provided on the interconnect layer 102. For the insulating layer 103, for example, SiO is used.

On the insulating layer 103, a plurality of interconnect layers 104 and a plurality of insulating layers 105 are alternately stacked one by one on the insulating layer 103. In the example shown in FIG. 5, nine interconnect layers 104 and nine insulating layers 105 are alternately stacked one by one. The interconnect layers 104 respectively function as the select gate line SGS and the word lines WL0 to WL7 in order from the lowermost layer. The interconnect layers 104 include a conductive material. For the conductive material, a metal material, an n-type semiconductor, or a p-type semiconductor may be used. The p-type semiconductor contains, for example, impurities such as boron (B). Hereinafter, a case of using, for the conductive material of the interconnect layers 104, a layered structure of titanium nitride (TiN) and tungsten (W) will be described. The TiN is formed in such a manner as to cover the W. TiN has a function as a barrier layer for preventing a reaction between W and SiO or as an adhesive layer for improving adhesion of W when a layer of W is formed by, for example, chemical vapor deposition (CVD). The interconnect layers 104 may contain a high dielectric constant material such as aluminum oxide (AlO) containing oxygen and aluminum. In this case, the high dielectric constant material is formed in such a manner as to cover the conductive material. For example, in each interconnect layer 104, AlO is provided in such a manner as to be in contact with the insulating layers provided above and below each interconnect layer 104 and the side surface of the memory pillar MP. TiN is provided in such a manner as to be in contact with AlO. W is then provided in such a manner as to be in contact with TiN and fill the inside of each interconnect layer. For the insulating layer 105, for example, SiO is used.

The plurality of memory pillars MP are provided in the memory cell array 17. One memory pillar MP corresponds to one NAND string NS. The memory pillars MP extend in the Z direction. The memory pillars MP each penetrate nine interconnect layers 104. The bottom surface of each memory pillar MP reaches the interconnect layer 102.

The memory pillars MP each include a block insulating film 106, a charge storage layer 107, a tunnel insulating film 108, a semiconductor layer 109, a core layer 110, and a capping layer 111.

More specifically, memory holes MH each penetrating the insulating layer 103, the plurality of interconnect layers 104, and the plurality of insulating layers 105 are provided. The bottom surface of each memory hole MH reaches the interconnect layer 102. The memory holes MH correspond to the memory pillars MP. On each side surface of each memory hole MH, the block insulating film 106, the charge storage layer 107, and the tunnel insulating film 108 are stacked in order from the outer side. For example, in the case of the holes MH formed into a cylindrical shape, each of the block insulating film 106, the charge storage layer 107, and the tunnel insulating film 108 has a cylindrical shape. The semiconductor layer 109 is provided in such a manner as to be in contact with the side surface of the tunnel insulating film 108. A bottom surface of the semiconductor layer 109 is in contact with the interconnect layer 102. The semiconductor layer 109 is a region in which channels of the selection transistor ST2 and the memory cell transistors MC are formed. Therefore, the semiconductor layer 109 functions as a signal line that couples current paths of the selection transistor ST2 and the memory cell transistor MC0 to MC7. The inside of the semiconductor layer 109 is filled with the core layer 110. On the semiconductor layer 109 and the core layer 110, the capping layer 111 having its side surface in contact with the tunnel insulating film 108 is provided. That is, the memory pillars MP each penetrate the inside of each of the interconnect layers 104, and contain the semiconductor layer 109 extending in the Z direction. The capping layer 111 may be omitted.

For the block insulating film 106, the tunnel insulating film 108, and the core layer 110, for example, SiO is used. For the charge storage layer 107, for example, silicon nitride (SiN) is used. For the semiconductor layer 109 and the capping layer 111, for example, polysilicon is used.

The memory pillar MP in combination with eight interconnect layers 104 respectively functioning as the word lines WL0 to WL7 respectively form the memory cell transistors MC0 to MC7. Similarly, the memory pillar MP in combination with the interconnect layer 104 functioning as the select gate line SGS form the selection transistor ST2.

An insulating layer 112 is provided above the memory pillars MP and the insulating layers 105. An insulating layer 113 is provided on the insulating layer 112. An insulating layer 114 is provided on the insulating layer 113. For the insulating layers 112 and 114, for example, SiO is used. The insulating layer 113 functions as an etching stopper when etching a trench TR (that is, a trench pattern) that penetrates the insulating layers 112, 113, and 114. The insulating layer 113 may be omitted. For the insulating layer 113, an insulating material that can provide an etching selectivity with the insulating layers 112 and 114 is used. For the insulating layer 113, for example, SiCN containing carbon, nitrogen, and silicon is used.

The trench TR is provided on each of the memory pillars MP. The trench TR penetrates the insulating layers 112 to 114. The select gate line SGD is provided inside the trench TR. Therefore, the trench TR extends in the X direction, as with the select gate line SGD described with reference to FIG. 4. The bottom surface of the trench TR is in contact with a portion of the upper surfaces of the plurality of memory cell transistors MC in each spring unit SU.

A semiconductor layer 115 is provided on a portion of the side surface and bottom surface of the trench TR on each memory pillar MP and the insulating layer 114. The semiconductor layer 115 functions as a coupling portion CZ. The semiconductor layer 115 has a bent shape (hereinafter, referred to as a crank shape) extending along the bottom surface and side surface of the trench TR and the upper surface of the insulating layer 114. More specifically, the semiconductor layer 115 includes two semiconductor layers **115*a*, two semiconductor layers 115*b*, and a semiconductor layer 115*c*. Two semiconductor layers 115*a* are respectively provided on the capping layers 111 of two memory pillars MP adjacent to each other in the A direction (or the B direction) on the bottom surface of the trench TR. The bottom surfaces of two semiconductor layers 115*b* are respectively in contact with two semiconductor layers 115*a*. The semiconductor layers 115*b* are arranged along the side surface of the trench TR. The semiconductor layer 115*c* is arranged in such a manner as to be in contact with the upper surfaces of two semiconductor layers 115*b* adjacent to each other in the A direction (or the B direction). Therefore, the semiconductor layer 115 includes the semiconductor layers 115*a* provided on the memory pillars MP, the semiconductor layers 115*b* provided on the side surface of the trench TR, and the semiconductor layer 115*c* provided on the insulating layer 114. The semiconductor layers 115*a* and 115*b* are regions in which a channel of the selection transistor ST1 is formed. The semiconductor layer 115*c* functions as an interconnect layer that couples two selection transistors ST1 to each other. With this shape, two selection transistors ST1 adjacent to each other in the A direction (or the B direction) are coupled to each other with the coupling portion CZ. For the semiconductor layer 115, for example, polysilicon or amorphous silicon may be used. For the semiconductor layer 115*c***, an n-type semiconductor or a p-type semiconductor may be used.

Insulating layers 116, 117, and 118 are provided on the side surface and bottom surface of the trench TR. The insulating layers 116, 117, and 118 cover the side surface and upper surface of the semiconductor layer **115*a* and the side surface of the semiconductor layer 115*b*. Portions of the insulating layers 116, 117, and 118 function as a gate insulating film of the selection transistor ST1. The present embodiment describes a case in which three insulating layers, 116, 117, and 118, are used for the gate insulating film; however, it suffices that the gate insulating film contains one or more layers. For example, for the gate insulating film, a MONOS structure (more specifically, a layered structure of the insulating layer, the charge storage layer, and the insulating layer) that enables control of a threshold voltage may be used. In this case, for example, SiO is used for the insulating layers 116 and 118, and SiN is used for the insulating layer 117. Hereinafter, a layered structure of the insulating layers 116, 117, and 118 will also be simply referred to as a layer stack 119**.

An interconnect layer 120 that extends in the X direction is provided in such a manner as to fill the inside of the layer stack 119. The interconnect layer 120 functions as the select gate line SGD. For example, the level of the upper surface of the interconnect layer 120 is lower than the upper surfaces of the semiconductor layer 115 and the layer stack 119. For example, the interconnect layer 120 is made of a conductive material. For the conductive material, for example, an n-type semiconductor, a p-type semiconductor, or a metal material is used.

The semiconductor layers **115*a* and 115*b* and portion of the layer stack 119 in combination with the interconnect layer 120 form the selection transistor ST1**.

An insulating layer 121 is provided on the insulating layer 114, the semiconductor layer 115, the layer stack 119, and the interconnect layer 120. An insulating layer 122 is provided on the insulating layer 121. An insulating layer 123 is provided on the insulating layer 122. For the insulating layers 121 and 123, for example, SiO is used. The insulating layer 122 functions as an etching stopper when etching a contact plug CP1. The insulating layer 122 may be omitted. For the insulating layer 122, an insulating material that can provide an etching selectivity with the insulating layers 121 and 123 is used. For the insulating layer 122, for example, SiCN is used.

A conductor 124 functioning as the contact plug CP1 is provided on the semiconductor layer **115*c***.

A conductor 125 functioning as a contact plug CP2 is provided on the conductor 124.

An interconnect layer 126 is provided on the conductor 125. The interconnect layer 126 extends in the Y direction. The interconnect layer 126 functions as a bit line BL.

The conductors 124 and 125 and the interconnect layer 126 are made of a conductive material. For the conductive material, for example, a metal material is used.

1.1.6 Arrangement of Selection Transistor ST1 and Select Gate Line SGD

Figure 6:
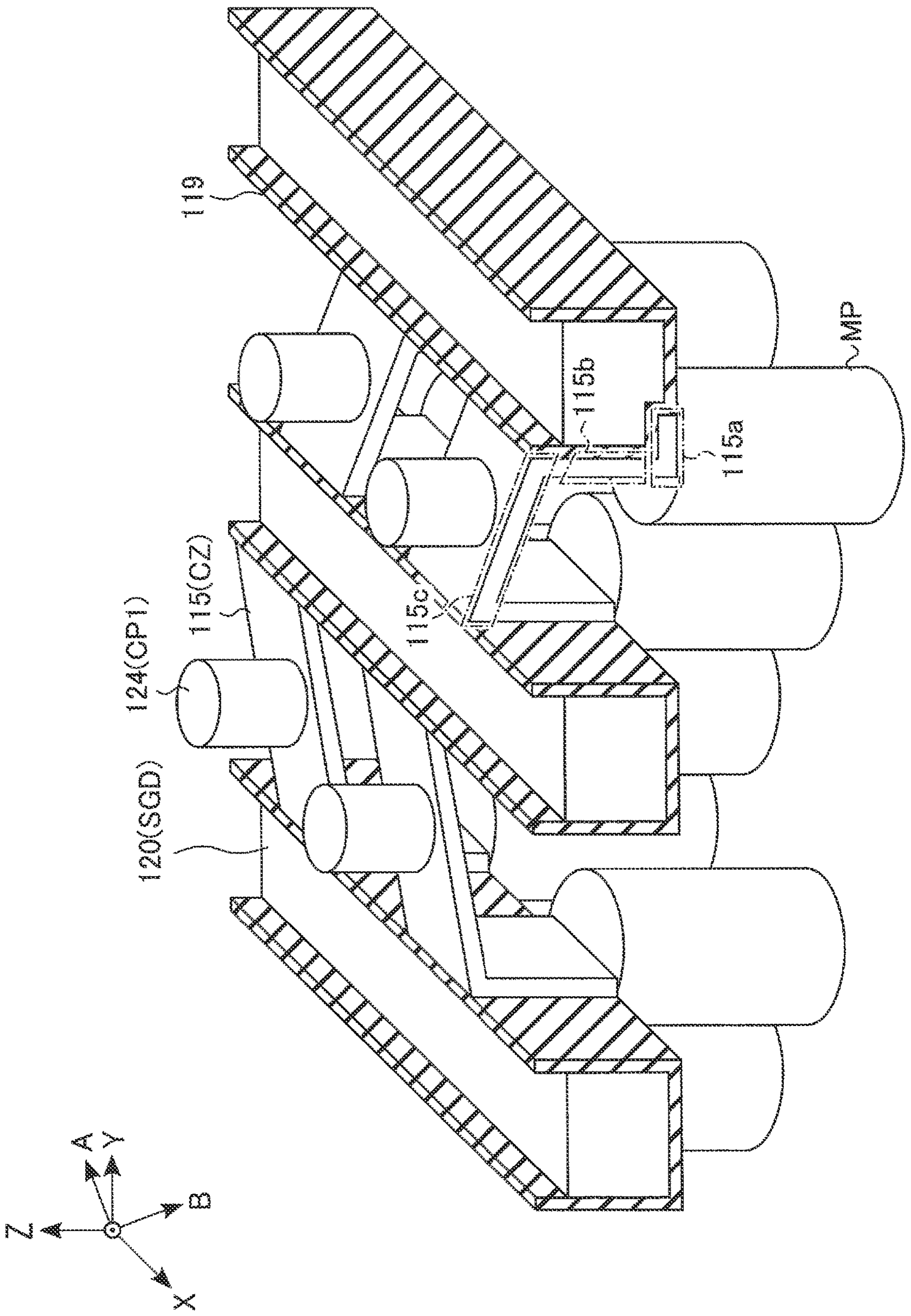
FIG. 6 is a perspective view of the memory cell In the example shown in FIG. array according to the first embodiment.

Next, one example of arrangement of the selection transistors ST1 and the select gate lines SGD will be described with reference to FIG. 6. FIG. 6 is a perspective view showing arrangement of the upper portion of the memory pillars MP, the semiconductor layer 115, the layer stack 119, the interconnect layer 120, and the contact plug CP1. In the example shown in FIG. 6, some of the insulating layers are omitted in order to simplify the description.

As shown in FIG. 6, for example, the interconnect layer 120 is provided on the plurality of memory pillars MP arranged in two rows and in a staggered fashion in the X direction. The layer stack 119 is provided in such a manner as to cover the side surface and the bottom surface of the interconnect layer 120. The semiconductor layer **115*a* is provided on each of the memory pillars MP. The semiconductor layer 115*b* that is in contact with the side surface of the layer stack 119 is provided on the semiconductor layer 115*a*. The semiconductor layer 115*c* is provided on the semiconductor layer 115*b*. The semiconductor layer 115*c* couples the semiconductor layers 115*b* respectively provided on two memory pillars MP that are adjacent to each other in the A direction or the B direction, between two interconnect layers 120. The conductor 124 is provided on the semiconductor layer 115 (115***c*).

1.1.7 Configuration of Sense Amplifier and Data Register

Figure 7:
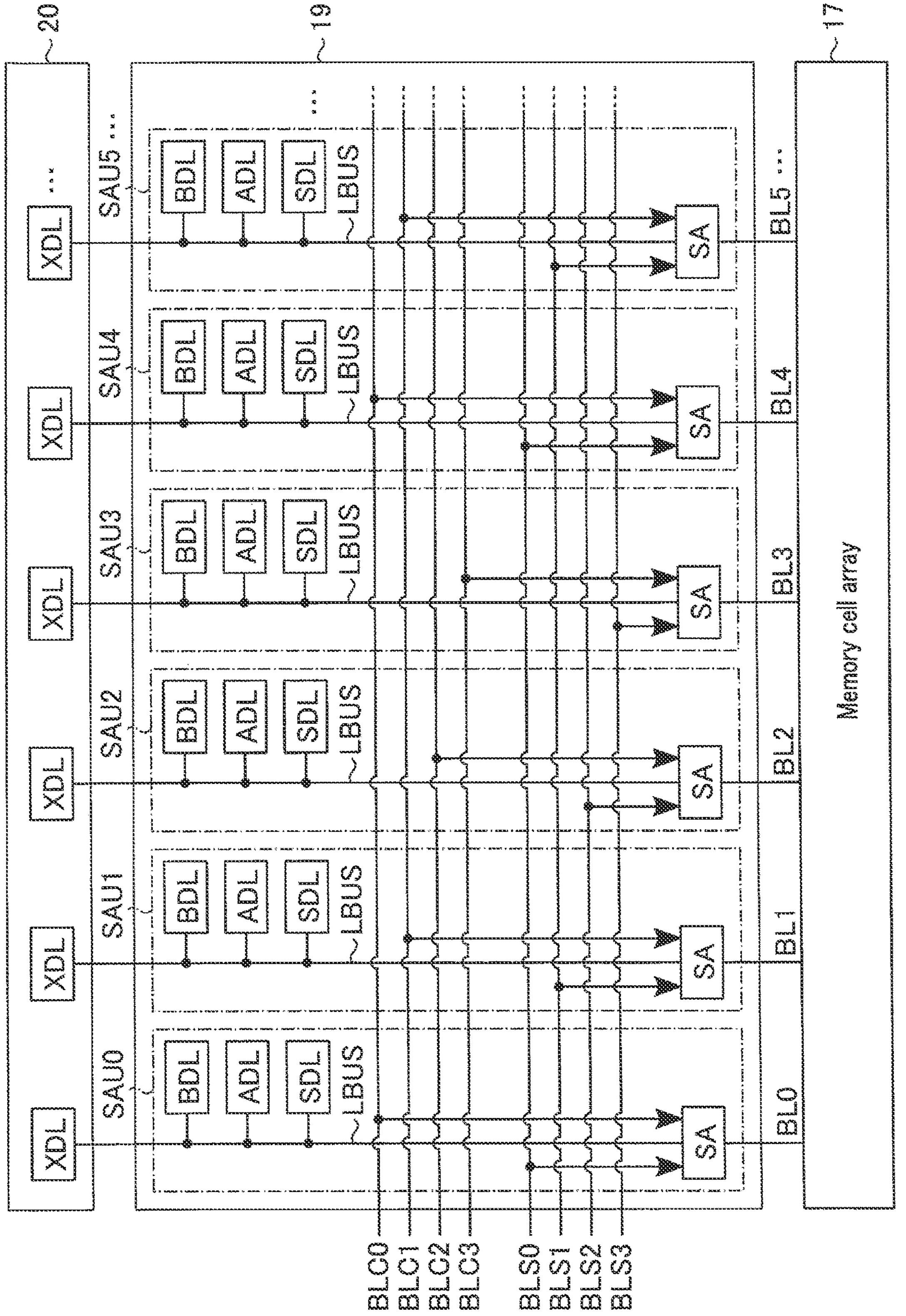
FIG. 7 is a block diagram of a sense amplifier according to the first embodiment.

Next, one example of a configuration of the sense amplifier 19 and the data register 20 will be described with reference to FIG. 7. FIG. 7 is a block diagram of the sense amplifier 19 and the data register 20.

As shown in FIG. 7, the sense amplifier 19 includes a plurality of sense amplifier units SAU respectively provided for bit lines BL. For example, sense amplifier units corresponding to BL0, BL1, BL2, BL3, BL4, and BL5 will be respectively referred to as SAU0, SAU1, SAU2, SAU3, SAU4, and SAU5.

The data register 20 includes a plurality of latch circuits XDL respectively provided for the sense amplifier units SAU. The latch circuits XDL are used for input and output of data between the sense amplifier units SAU and the input/output circuit 10. More specifically, write data is transmitted from the input/output circuit 10 through the latch circuit XDL to a latch circuit SDL, ADL, or BDL, or to the sense circuit SA. Furthermore, read data is transmitted from the latch circuit SDL, ADL, or BDL, or the sense circuit SA through the latch circuit XDL to the input/output circuit 10.

Next, the internal configuration of each sense amplifier unit SAU will be described. Each of the sense amplifier units SAU includes, for example, the sense amplifier unit SA and the latch circuits SDL, ADL, and BDL. The sense circuit SA and the latch circuits SDL, ADL, and BDL are coupled in common to the corresponding latch circuit XDL via a bus LBUS. In other words, the latch circuit XDL, the sense circuit SA, and the latch circuits SDL, ADL, and BDL are coupled in such a manner that data can be transmitted and received therebetween via the bus LBUS.

Each of the sense amplifiers SA senses a voltage of a corresponding bit line BL or a current flowing through the corresponding bit line BL during a read operation. Based on a result of sensing, the sense circuit SA determines whether read data is “0” or “1”. The sense circuit SA applies a voltage to the corresponding bit line BL based on the write data during a write operation.

Coupling of each sense circuit SA to a corresponding bit line BL is controlled based on, for example, signals BLC and BLS. The signals BLC and BLS are control signals for transistors provided in each sense circuit SA. For example, the sequencer 14 generates the signals BLC and BLS. The sense circuits SA will be described later in detail.

For example, signals BLC0 and BLS0 correspond to the bit line BL(4*n*). Signals BLC1 and BLS1 correspond to the bit line BL(4*n*+1). Signals BLC2 and BLS2 correspond to the bit line BL(4*n*+2). Signals BLC3 and BLS3 correspond to the bit line BL(4*n*+3). In the example shown in FIG. 7, the signals BLC0 and BLS0 are transmitted to the sense amplifier units SAU0 and SAU4. The signals BLC1 and BLS1 are transmitted to the sense amplifier units SAU1 and SAU5. The signals BLC2 and BLS2 are transmitted to the sense amplifier unit SAU2. The signals BLC3 and BLS3 are transmitted to the sense amplifier unit SAU3.

The latch circuits SDL, ADL, and BDL temporarily store data. For example, read data is transferred from the sense circuit SA to one of the latch circuits SDL, ADL, and BDL. Furthermore, for example, write date is transferred from the latch circuit XDL to one of the latch circuits SDL, ADL, and BDL.

A configuration of each sense amplifier unit SAU is not limited to the above, and various modifications can be made. For example, the number of latch circuits included in each sense amplifier unit SAU may be set based on the number of data bits that a single memory cell transistor MC can store.

1.1.8 Configuration of Sense Circuit

Figure 8:
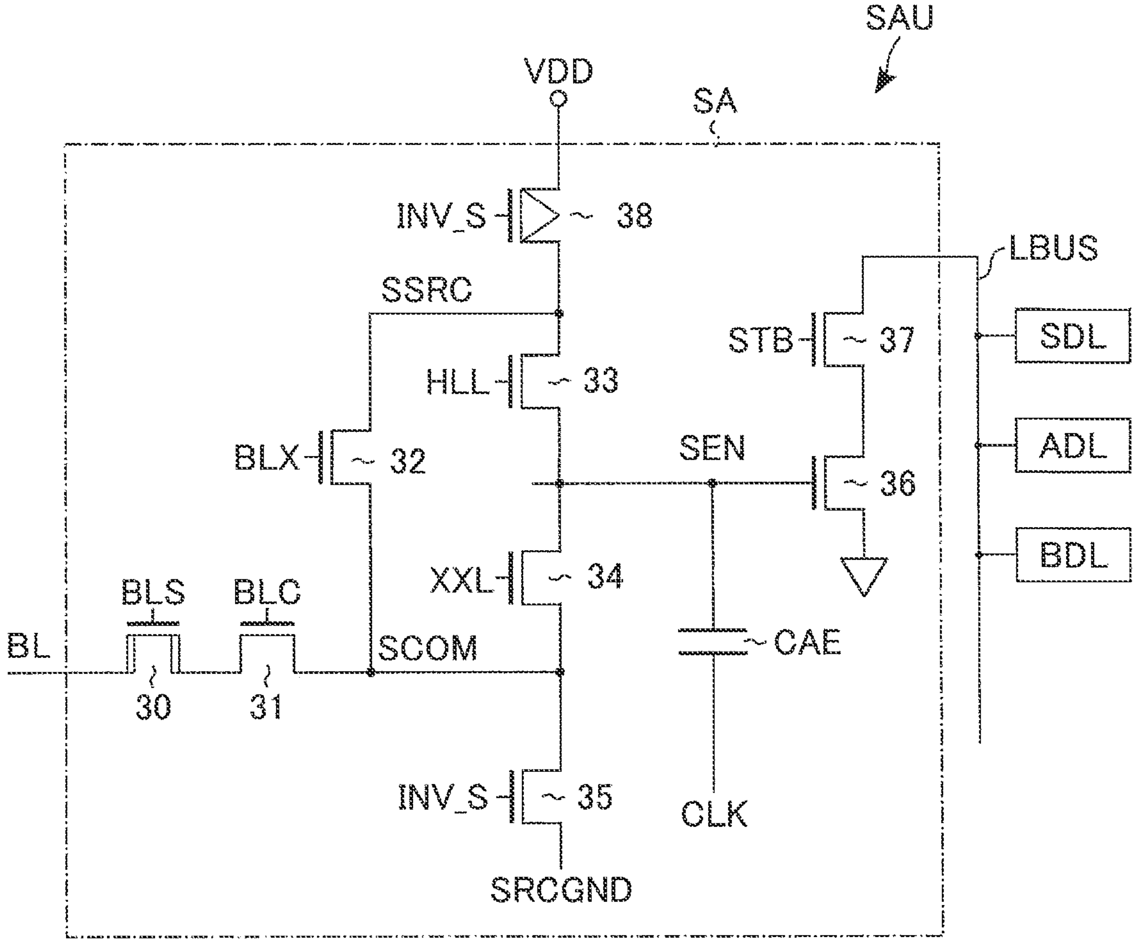
FIG. 8 is a circuit diagram of a sense amplifier unit according to the first embodiment.

Next, with reference to FIG. 8, an exemplary configuration of each sense circuit SA will be described. FIG. 8 is a circuit diagram of each sense circuit SA. According to the present embodiment, the sense circuit SA of a current sensing type which senses a current flowing through a bit line BL will be described as an example. Hereinafter, when a source and a drain of a transistor are not distinguished from each other, one of them will be referred to as “one end of a transistor” and the other of them will be referred to as “the other end of the transistor”.

As shown in FIG. 8, for example, each sense circuit SA includes transistors 30 to 38 and a capacitor element CAE. For example, the transistor 30 is an n-type MOS transistor having a high breakdown voltage. Each of the transistors 31 to 37 is an n-type MOS transistor having a low breakdown voltage. The transistor 38 is a p-type MOS transistor having a low breakdown voltage.

One end of the transistor 30 is coupled to the corresponding bit line BL. The other end of the transistor 30 is coupled to one end of the transistor 31. A signal BLS is input to a gate of the transistor 30.

The other end of the transistor 31 is coupled to a node SCOM. A signal BLC is input to a gate of the transistor 31. The transistor 31 functions as a clamp transistor that clamps a voltage that is applied to the bit line BL in accordance with the signal BLC.

One end of the transistor 32 is coupled to a node SSRC. The other end of the transistor 32 is coupled to the node SCOM. A signal BLX is input to a gate of the transistor 32.

One end of the transistor 33 is coupled to the node SSRC. The other end of the transistor 33 is coupled to a node SEN. A signal HLL is input to a gate of the transistor 33.

One end of the transistor 34 is coupled to the node SEN. The other end of the transistor 34 is coupled to the node SCOM. A signal XXL is input to a gate of the transistor 34.

One end of the transistor 35 is coupled to the node SCOM. The other end of the transistor 35 is coupled to a node SRCGND. The node SRCGND receives, for example, application of a ground voltage VSS. A gate of the transistor 35 is coupled to a node INV_S in a latch circuit SDL, for example.

One end of the transistor 36 is coupled to one end of the transistor 37. The other end of the transistor 36 is grounded (coupled to a ground voltage interconnect). A gate of the transistor 36 is coupled to the node SEN. The transistor 36 functions as a sense transistor that senses a voltage of the node SEN.

The other end of the transistor 37 is coupled to a bus LBUS. A signal STB is input to a gate of the transistor 37. The sense circuit SA determines data based on timing when the signal STB is asserted.

A power supply voltage VDD, for example, is applied to one end of the transistor 38. The other end of the transistor 38 is coupled to the node SSRC. The gate of the transistor 38 is coupled to a node INV_S in the latch circuit SDL, for example.

One electrode of the capacitor element CAE is coupled to the node SEN. A clock signal CLK is input to the other electrode of the capacitor element CAE.

The signals BLS, BLC, BLX, HLL, XXL, and STB and the clock signal CLK are generated by, for example, the sequencer 14.

Next, an operation of the sense circuit SA during a sense operation will be briefly described. When reading data, the node INV_S is set to a low ("L") level. By this, the transistor 38 is turned to the ON state. The transistor 35 is turned to the OFF state. As a result, the voltage VDD is applied to the node SSRC.

When the signal BLX at a high ("H") level is applied in this state, the transistor 32 is turned to the ON state. By this, the voltage VDD is applied to the node SCOM. When the signal BLC (clamp voltage) is applied, the transistor 31 clamps the voltage VDD to a voltage based on the signal BLC. When the signal BLS at the "H" level is applied, the transistor 30 is turned to the ON state. By this, the corresponding bit line BL is pre-charged, via the transistors 38, 32, 31, and 30, to a voltage based on the signal BLC. For example, if the corresponding bit line BL is a non-selected bit line, the signals BLS and BLC are set to the "L" level. By this, the transistors 30 and 31 are turned to the OFF state. For this reason, no voltage is applied to the non-selected bit line BL.

When the signal HLL at the "H" level is applied during the bit line BL pre-charge, the transistor 33 is turned to the ON state. By this, the node SEN is pre-charged to the voltage VDD. Thereafter, the signal HLL is set to the "L" level, and the transistor 33 is turned to the OFF state. Next, when the signal XXL at the "H" level is applied, the transistor 34 is turned to the ON state. In the case where a threshold voltage of the memory cell transistor MC which is a read target (also referred to as a "selected memory cell transistor MC" hereinafter) is lower than a read voltage, the selected memory cell transistor MC is turned to the ON state. In this case, a current flows from the bit line BL to the source line SL, and thus a potential of the node SEN falls. When the potential of the node SEN falls below a threshold voltage of the transistor 36, the transistor 36 is turned to the OFF state. On the other hand, in the case where the threshold voltage of the selected memory cell transistor MC is a read voltage or greater, the selected memory cell transistor MC is turned to the OFF state. In this case, a current flows very little from the bit line BL to the source line SL, and thus the potential of the node SEN is almost maintained. As a result, the transistor 36 is turned to the ON state.

When the signal STB at the "H" level is applied, the transistor 37 is turned to the ON state. While the transistor 37 is in the ON state, a potential based on the determination of ON/OFF (state) of the transistor 36 is read into the bus LBUS. Hereinafter, this operation will be referred to as a "strobe operation". In the case where the transistor 36 is in the OFF state, that is, the selected memory cell transistor MC is an on-cell, the bus LBUS is set to the "H" level through the strobe operation. In the case where the transistor 36 is in the ON state, that is, the selected memory cell transistor MC is an off-cell, the bus LBUS is set to the "L" level through the strobe operation. In the case where the bus LBUS is at the "H" level, for example, "1" data is stored in the latch circuit SDL. On the other hand, in the case where the bus LBUS is at the "L" level, for example, "0" data is stored in the latch circuit SDL.

In the case where the latch circuit SDL stores "1" data, the node INV_S is set to the "H" level. On the other hand, in the case where the latch circuit SDL stores "0" data, the node INV_S is set to the "L" level.

1.2 Threshold Voltage Distribution of Memory Cell Transistor

Figure 9:
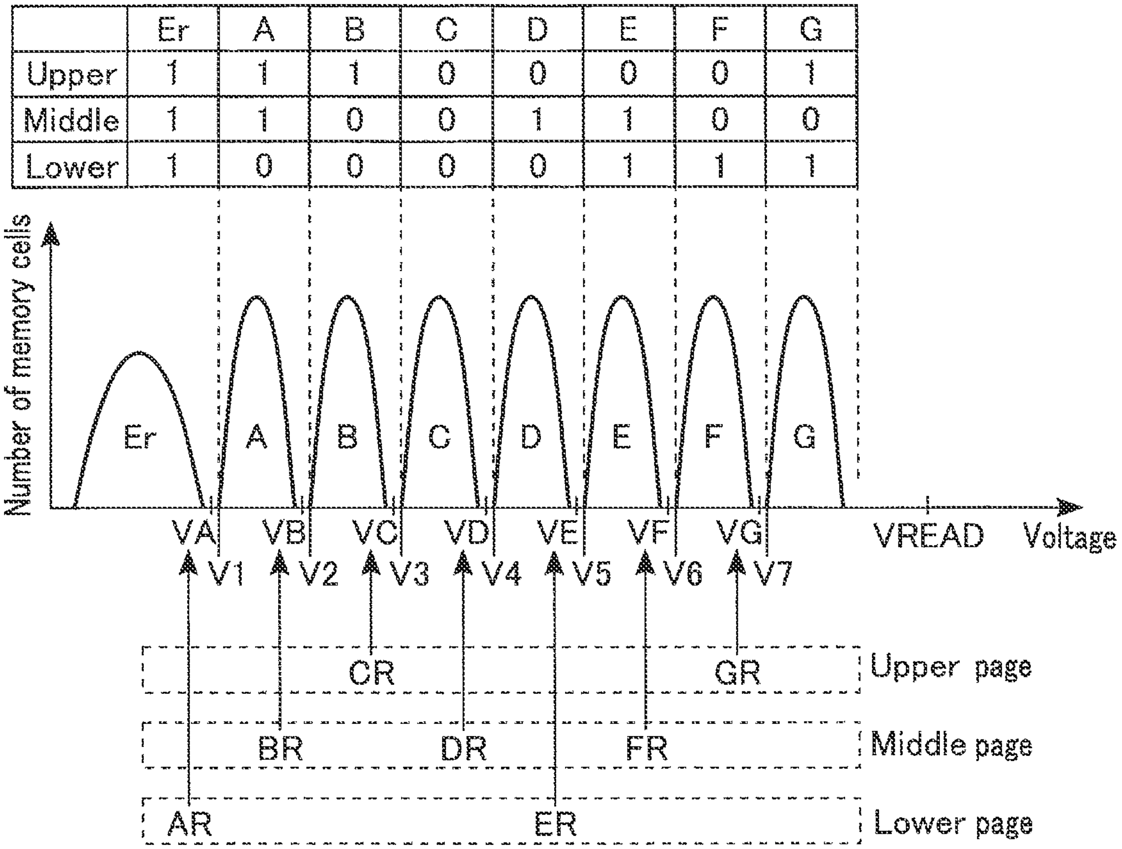
FIG. 9 shows threshold distributions of memory cell transistors according to the first embodiment.

Next, one example of the threshold voltage distributions that may be observed in the memory cell transistors MC will be described with reference to FIG. 9. FIG. 9 is a diagram showing a relationship between threshold voltage distributions observed in the memory cell transistors MC and data allocation. In the present embodiment, a case in which one memory cell transistor MC is a triple level cell (TLC) that can store octal data (three-bit data) will be described hereinafter. However, the maximum data per memory cell transistor MC is not limited to octal data. In the present embodiment, it suffices that the memory cell transistors MC each can store any type of data equal to or greater than binary data (one-bit data).

As shown in FIG. 9, a threshold voltage of each memory cell transistor MC takes a value that falls within one of, for example, eight discrete distributions. The eight distributions will be referred to as an "Er" state, an "A" state, a "B" state, a "C" state, a "D" state, an "E" state, an "F" state, and a "G" state in ascending order of threshold voltage.

The "Er" state corresponds to, for example, a state in which data has been erased. The "A" to "G" states correspond to a state in which data is written by injecting charge into a charge storage layer. In a write operation, verify voltages corresponding to the threshold voltage distributions will be referred to as V1 to V7, respectively. These voltage values establish a relationship of V1<V2<V3<V4<V5<V6<V7<VREAD. The voltage VREAD is a voltage to be applied to a word line WL that does not correspond to the selected memory cell transistor MC during the read operation (hereinafter, referred to as a "non-selected word line"). The memory cell transistor MC is, when the voltage VREAD is applied to its gate, turned to the ON state regardless of data stored therein.

More specifically, a threshold voltage included in the "Er" state is smaller than a voltage V1. A threshold voltage included in the "A" state is the voltage V1 or greater and smaller than a voltage V2. A threshold voltage included in the "B" state is the voltage V2 or greater and smaller than a voltage V3. A threshold voltage included in the "C" state is the voltage V3 or greater and smaller than a voltage V4. A threshold voltage included in the "D" state is the voltage V4 or greater and smaller than a voltage V5. A threshold voltage included in the "E" state is the voltage V5 or greater and smaller than a voltage V6. A threshold voltage included in the "F" state is the voltage V6 or greater and smaller than a voltage V7. A threshold voltage included in the "G" state is the voltage V7 or greater and smaller than a voltage VREAD.

Hereinafter, read voltages corresponding to the above states will be referred to as VA to VG, respectively. The read voltages VA to VG may be respectively the same as or different from verify voltages V1 to V7.

Hereinafter, read operations corresponding to the "A" state to "G" state will be referred to as read operations AR, BR, CR, DR, ER, FR, and GR, respectively. The read operation AR determines whether or not the threshold voltage of the memory cell transistor MC is smaller than the voltage VA. The read operation BR determines whether or not the threshold voltage of the memory cell transistor MC is smaller than the voltage VB. The read operation CR determines whether or not the threshold voltage of the memory cell transistor MC is smaller than the voltage VC. The read operation DR determines whether or not the threshold voltage of the memory cell transistor MC is smaller than the voltage VD. The read operation ER determines whether or not the threshold voltage of the memory cell transistor MC is smaller than the voltage VE. The read operation FR determines whether or not the threshold voltage of the memory cell transistor MC is smaller than the voltage VF. The read operation GR determines whether or not the threshold voltage of the memory cell transistor MC is smaller than the voltage VG.

Each of the memory cell transistors MC belongs to one of eight threshold voltage distributions, thereby taking a corresponding one of eight states. These states are assigned to "000" to "111" in the binary system. In this manner, each of the memory cell transistors MC is capable of storing three-bit data. Hereinafter, bits constituting three-bit data will be referred to as a lower bit, a middle bit, and an upper bit. Furthermore, a set of lower bits in the cell unit CU will be referred to as a lower page. A set of middle bits in the cell unit CU will be referred to as a middle page. A set of upper bits in the cell unit CU will be referred to as an upper page.

In the example of FIG. 9, with respect to the memory cell transistors MC included in the respective threshold voltage distributions, data of "upper bit/middle bit/lower bit" is allocated as presented below.

"Er" state: "111" data
"A" state: "110" data
"B" state: "100" data
"C" state: "000" data
"D" state: "010" data
"E" state: "011" data
"F" state: "001" data
"G" state: "101" data In the case of reading data, the lower bit is determined through the read operations AR and ER. The middle bit is determined through the read operations BR, DR, and FR. The upper bit is determined through the read operations CR and GR. That is, a value of the lower bit, a value of the middle bit, and a value of the upper bit are determined through two read operations, three read operations, and two read operations, respectively. Hereinafter, this data allocation will be referred to as "2-3-2 coding". However, the data allocation to the "Er" to "G" states is not limited to 2-3-2 coding.

1.3 Selection of Select Gate Line and Bit Line in Read Operation and Write Operation Next, one example of selection of the select gate line SGD and the bit line BL during the read operation and the write operation will be described with reference to FIG. 10. In the present embodiment, one or two string units SU are selectable during the read operation and the write operation. In other words, one or two select gate lines SGD are selectable during the read operation and the write operation. For example, in the case of selecting two string units SU, that is, selecting two select gate lines SGD, two cell units CU are selected. Accordingly, 2-SGD selection operation is greater in data length, that is, in number of selected memory cell transistors MC, than 1-SGD selection operation. Two cell units CU are coupled in common to a single word line WL and are coupled to different bit lines BL. Hereinafter, a case in which one select gate line SGD is selected will be referred to as "1-SGD selection operation" or simply as "1-SGD selection". On the other hand, a case in which two select gate lines SGD are selected will be referred to as "2-SGD selection operation" or simply as "2-SGD selection". In the following description, select gate lines SGD corresponding to the string units SU(4*m*) to SU(4*m*+3) will be referred to as select gate lines SGD(4*m*) to SGD(4*m*+3).

As shown in FIG. 10, the select gate lines SGD0 to SGD7 are roughly divided into even-numbered select gate lines SGDe and odd-numbered select gate lines SGDo.

First, the even-numbered select gate lines SGDe will be described. The even-numbered select gate lines SGDe contain the select gate lines SGD(4*m*) and SGD(4*m*+2). More specifically, the even-numbered select gate lines SGDe contain the select gate lines SGD0, SGD2, SGD4, and SGD6.

During the 1-SGD selection operation, in the case of selecting the select gate line SGD(4*m*), that is, selecting the select gate line SGD0 or SGD4, the bit lines BL(4*n*) and BL(4*n*+2) are selected. More specifically, for example, the bit lines BL0, BL2, BL4, BL6, . . . are selected. Then, the bit lines BL(4*n*+1) and BL(4*n*+3) are not selected. More specifically, for example, the bit lines BL1, BL3, BL5, BL7, . . . are not selected. Hereinafter, during the read operation and the write operation, a selected bit line BL will be referred to as a "selected bit line". During the read operation and the write operation, a not selected bit line BL will be referred to as a "non-selected bit line".

During the 1-SGD selection operation, in the case of selecting the select gate line SGD(4*m*+2), that is, selecting the select gate line SGD2 or SGD6, the bit lines BL(4*n*+1) and BL(4*n*+3) are selected. More specifically, for example, the bit lines BL1, BL3, BL5, BL7, . . . are selected. Then, the bit lines BL(4*n*) and BL(4*n*+2) are not selected. More specifically, for example, the bit lines BL0, BL2, BL4, BL6, . . . are not selected.

As described in the above, during the 1-SGD selection operation, in the case of selecting one of the even-numbered select gate lines SGDe, the selected bit lines BL and non-selected bit lines BL are alternately selected for each line. That is, in the configuration of the memory cell array 17, bit lines BL arranged on both sides of a selected bit line BL are not selected. More specifically, for example, in the case of selecting the bit line BL2, the bit lines BL1 and BL3 arranged adjacent to the bit line BL2 are not selected.

In the case of the even-numbered select gate lines SGDe, two select gate lines SGD0 and SGD2 corresponding to m=0 form a pair for the 2-SGD selection operation. Similarly, two select gate lines SGD4 and SGD6 corresponding to m=1 form a pair for the 2-SGD selection operation. For example, during the 2-SGD selection operation, by selecting the select gate lines SGD0 and SGD2, all of the bit lines BL are selected. The same applies to the case of selecting the select gate lines SGD4 and SGD6.

Next, the odd-numbered select gate lines SGDo will be described. The odd-numbered select gate lines SGDo contain the select gate lines SGD(4*m*+1) and SGD(4*m*+3). More specifically, the odd-numbered select gate lines SGDo contain the select gate lines SGD1, SGD3, SGD5, and SGD7.

During the 1-SGD selection operation, in the case of selecting the select gate line SGD(4*m*+1), that is, selecting the select gate line SGD1 or SGD5, the bit lines BL(4*n*+2) and BL(4*n*+3) are selected. More specifically, for example, the bit lines BL2, BL3, BL6, BL7, . . . are selected. Then, the bit lines BL(4*n*) and BL(4*n*+1) are not selected. More specifically, for example, the bit lines BL0, BL1, BL4, BL5, . . . are not selected.

During the 1-SGD selection operation, in the case of selecting the select gate line SGD(4*m*+3), that is, selecting the select gate line SGD3 or SGD7, the bit lines BL(4*n*) and BL(4*n*+1) are selected. More specifically, for example, the bit lines BL0, BL1, BL4, BL5, . . . are selected. Then, the bit lines BL(4*n*+2) and BL(4*n*+3) are not selected. More specifically, for example, the bit lines BL2, BL3, BL6, BL7, . . . are not selected.

As described in the above, during the 1-SGD selection operation, in the case of selecting one of the odd-numbered select gate lines SGDo, the selected bit lines BL and non-selected bit lines BL are alternately selected for each set of two lines. That is, in the configuration of the memory cell array 17, in the case where bit lines BL are arranged on both sides of a selected bit line BL, one of two adjacent bit lines BL is not selected. More specifically, for example, in the case of selecting the bit line BL1, the bit line BL0 is selected. The bit line BL2 is not selected.

In the case of the odd-numbered select gate lines SGDo, two select gate lines SGD1 and SGD3 corresponding to m=0 form a pair for the 2-SGD selection operation. Similarly, two select gate lines SGD5 and SGD7 corresponding to m=1 form a pair for the 2-SGD selection operation. For example, during the 2-SGD selection operation, by selecting the select gate lines SGD1 and SGD3, all of the bit lines BL are selected. The same applies to the case of selecting the select gate lines SGD5 and SGD7.

1.4 Voltage of Each Interconnect in Read Operation

Next, an example of a voltage of each interconnect during the read operation will be described. Hereinafter, as one example of the read operation, a lower-page read operation will be described. For example, the lower-page read operation performs the read operation AR for the "A" state and the read operation ER for the "E" state. For example, the lower-page read operation performs the read operation AR first, and then the read operation ER.

1.4.1 Voltage of Each Interconnect During 2-SGD Select Read Operation

Figure 11:
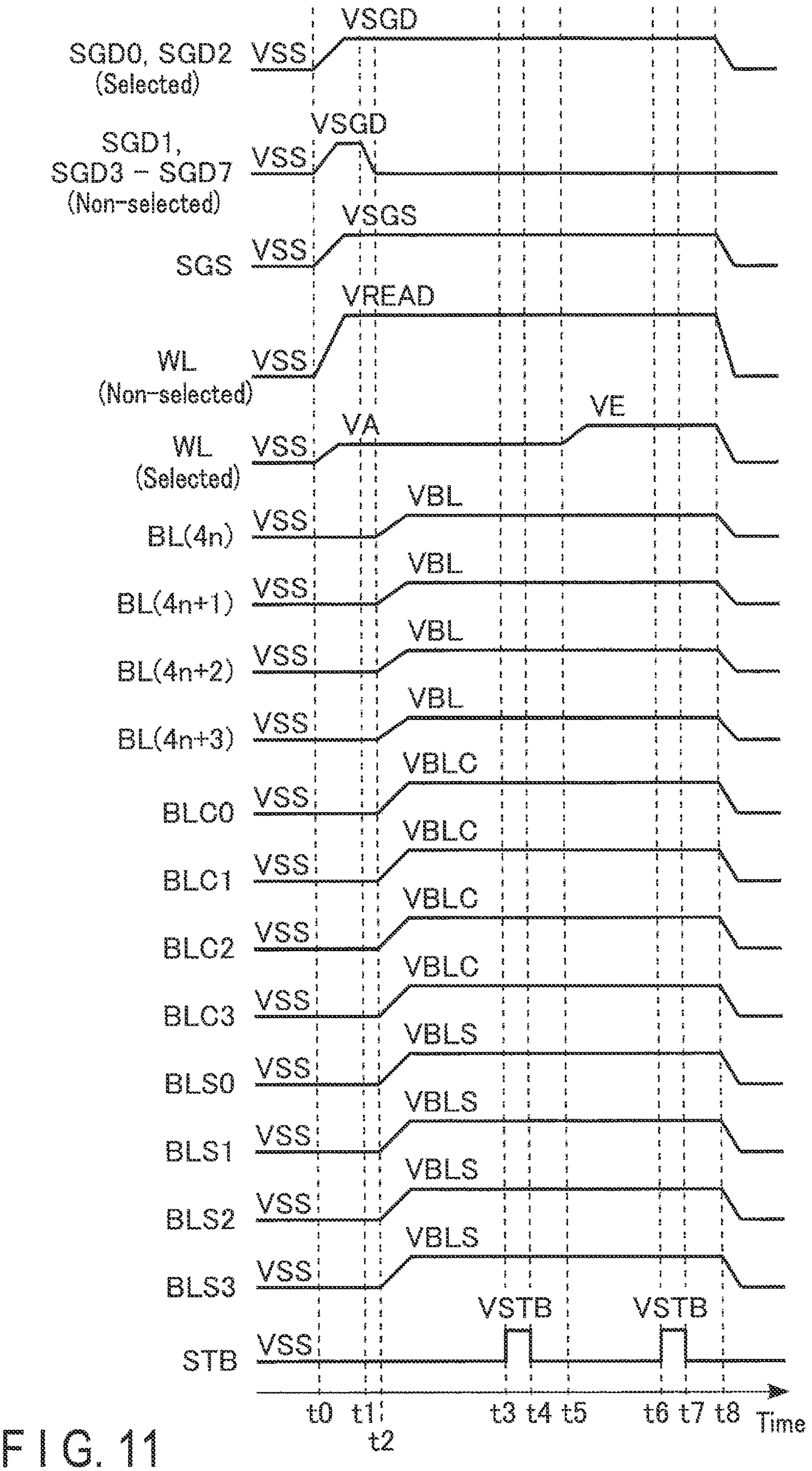
FIG. 11 is a timing chart showing voltages of interconnects during 2-SGD selection read operation according to the first embodiment.

First, a voltage of each interconnect during the 2-SGD select read operation will be described with reference to FIG. 11. FIG. 11 is a timing chart showing a voltage of each interconnect during the 2-SGD select read operation on the lower page. In the example shown in FIG. 11, a case in which the select gate lines SGD0 and SGD2 are selected will be described.

As shown in FIG. 11, first, at time t0, the row decoder 18 applies a voltage VSGD to the select gate lines SGD0 and SGD2 that are selected for the 2-SGD selection. Similarly, the row decoder 18 applies the voltage VSGD to the non-selected select gate lines SGD1 and SGD3 to SGD7. The voltage VSGD is a voltage that turns the selection transistor ST1 to the ON state. The row decoder 18 applies the read voltage VA to the word line WL corresponding to the selected memory cell transistor MC (hereinafter, referred to as a "selected word line"). The row decoder 18 applies the voltage VREAD to the non-selected word lines WL. A voltage VSGS is applied to the select gate line SGS. The voltage VSGS is a voltage that turns the selection transistor ST2 to the ON state.

At time t1, the row decoder 18 applies a voltage VSS to the non-selected select gate lines SGD1 and SGD3 to SGD7. By this, the corresponding selection transistor ST1 is turned to the OFF state.

During a period from t2 to t5, the sequencer 14 performs the read operation AR. At time t2, the sequencer 14 sets voltages of the signals BLC0 to BLC3 to a voltage VBLC. The voltage VBLC is a voltage for clamping a voltage of the bit line BL to a voltage VBL. For example, in the case of the transistor 31 having the threshold voltage of Vth, the voltages VBLC and VBL establish a relationship of VBL=VBLC−Vth. The sequencer 14 sets voltages of the signals BLS0 to BLS3 to a voltage VBLS. The voltage VBLS is a voltage of the signal BLS at the "H" level. The transistor 30 to which the voltage VBLS has been applied is turned to the ON state. By this, the voltage VBL is applied to the bit lines BL(4*n*), BL(4*n*+1), BL(4*n*+2), and BL(4*n*+3). The voltage VBL is a voltage lower than the voltage VSGD.

During a period from t3 to t4, the strobe operation corresponding to the read operation AR is performed. At time t3, the sequencer 14 sets the signal STB to a voltage VSTB. The voltage VSTB is a voltage of the signal STB at the "H" level. By this, the transistor 37 is turned to the ON state. At time t4, the sequencer 14 sets the signal STB to the voltage VSS (voltage at the "L" level). By this, the transistor 37 is set to the OFF state.

Next, during a period from t5 to t8, the sequencer 14 performs the read operation ER. At time t5, the row decoder 18 applies the read voltage VE to the selected word line WL.

During a period from t6 to t7, the strobe operation corresponding to the read operation ER is performed. At time t6, the sequencer 14 sets the signal STB to the voltage VSTB. By this, the transistor 37 is turned to the ON state. At time t7, the sequencer 14 sets the signal STB to the voltage VSS. By this, the transistor 37 is turned to the OFF state.

At time t8, a refresh operation is performed, and the voltage VSS is applied to each interconnect.

1.4.2. Voltage of Each Interconnect During 1-SGD Select Read Operation

Next, with reference to FIG. 12 to FIG. 15, a voltage of each interconnect during the 1-SGD select read operation will be described. FIG. 12 to FIG. 15 are each a timing chart showing a voltage of each interconnect during the 1-SGD select read operation on the lower page. In the example shown in FIG. 12, a case in which the select gate line SGD0 is selected will be described. In the example shown in FIG. 13, a case in which the select gate line SGD1 is selected will be described. In the example shown in FIG. 14, a case in which the select gate line SGD2 is selected will be described. In the example shown in FIG. 15, a case in which the select gate line SGD3 is selected will be described.

First, a case in which the select gate line SGD0, that is, the select gate line SGD(4*m*), is selected will be described, mainly focusing on the differences from FIG. 11.

Figure 12:
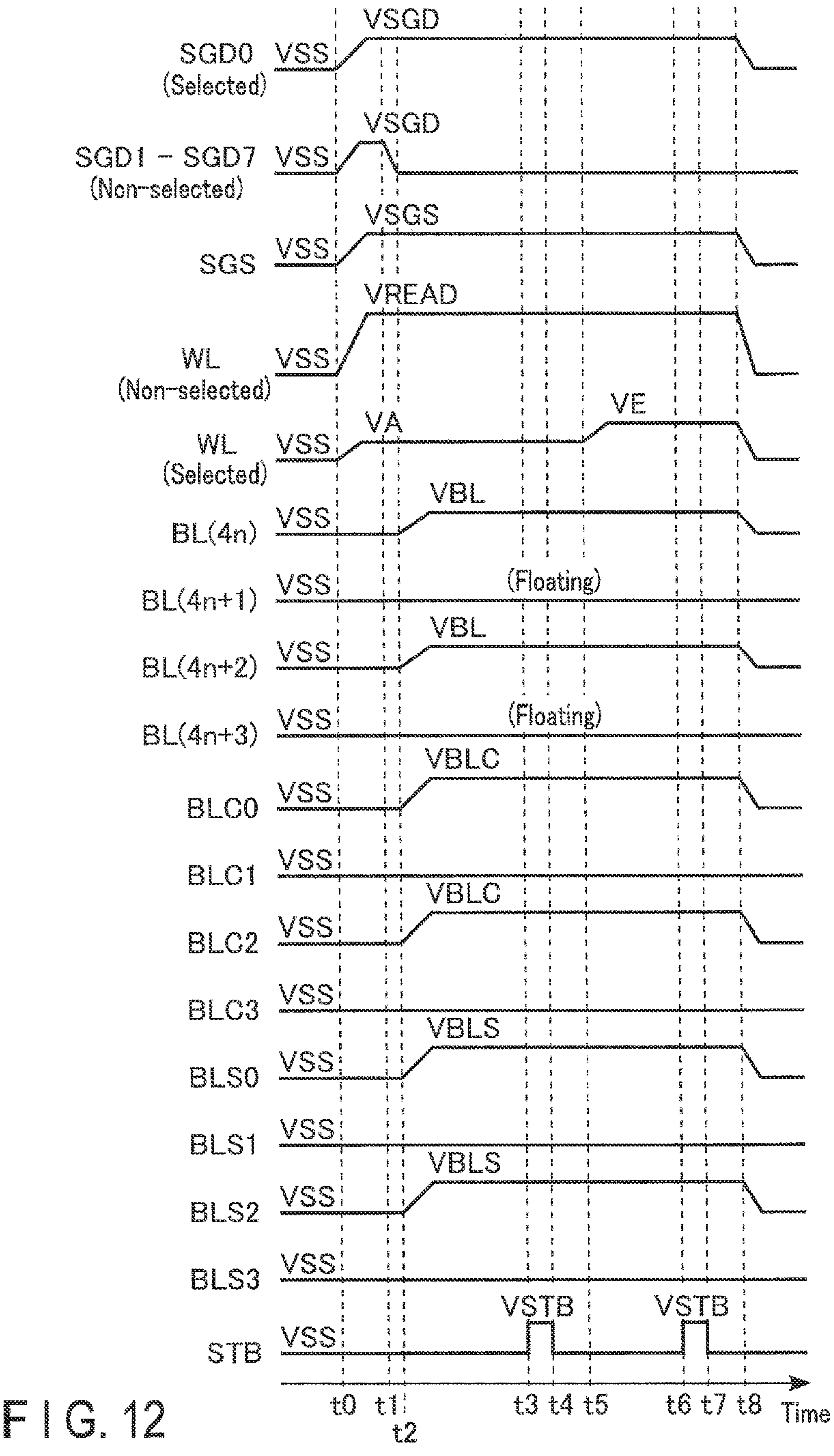
FIG. 12 is a timing chart showing voltages of interconnects during 1-SGD selection read operation according to the first embodiment.

As shown in FIG. 12, the description for the select gate line SGS, the selected word line WL, the non-selected word line WL, and the signal STB is the same as the description with reference to FIG. 11.

First, at time t0, the row decoder 18 applies the voltage VSGD to the select gate line SGD0 that is selected for the 1-SGD selection. Similarly, the row decoder 18 applies the voltage VSGD to the non-selected select gate lines SGD1 to SGD7.

At time t1, the row decoder 18 applies the voltage VSS to the non-selected select gate lines SGD1 to SGD7.

At time t2, the sequencer 14 sets voltages of the signals BLC0 and BLC2 to the voltage VBLC. The sequencer 14 sets voltages of the signals BLS0 and BLS2 to the voltage VBLS. By this, the voltage VBL is applied to the bit lines BL(4*n*) and BL(4*n*+2). At this time, since the selection transistor ST1 and the transistor 30 of the sense circuit SA are in the OFF state, the bit lines BL(4*n*+1) and BL(4*n*+3) are in a floating state. That is, the voltage VBL is applied to the selected bit line BL. The non-selected bit line BL is turned to the floating state.

During the 1-SGD select read operation, the bit line BL in the floating state is arranged adjacent to the selected bit line BL. Thus, the 1-SGD select read operation is smaller in capacitance between interconnects of the bit lines BL than the 2-SGD select read operation. This shortens a pre-charge time of each bit line BL and a time until a voltage of the node SEN becomes stable. Accordingly, a length from time t2 to time t3 during the 1-SGD select read operation can be made shorter than a length from time t2 to time t3 during the 2-SGD select read operation. Similarly, a length from time t5 to time t6 during the 1-SGD select read operation can be made shorter than a length from time t5 to time t6 during the 2-SGD select read operation.

Next, a case in which the select gate line SGD1, that is, the select gate line SGD(4m+1), is selected will be described, mainly focusing on the differences from FIG. 11.

As shown in FIG. 13, the description for the select gate line SGS, the selected word line WL, the non-selected word line WL, and the signal STB is the same as the description with reference to FIG. 11.

First, at time t0, the row decoder 18 applies the voltage VSGD to the select gate line SGD1 that is selected for the 1-SGD selection. Similarly, the row decoder 18 applies the voltage VSGD to the non-selected select gate lines SGD0 and SGD2 to SGD7.

At time t1, the row decoder 18 applies a voltage VSS to the non-selected select gate lines SGD0 and SGD2 to SGD7.

At time t2, the sequencer 14 sets voltages of the signals BLC2 and BLC3 to the voltage VBLC. The sequencer 14 sets voltages of the signals BLS2 and BLS3 to the voltage VBLS. By this, the voltage VBL is applied to the bit lines BL(4n+2) and BL(4n+3). At this time, the bit lines BL(4n) and BL(4n+1) are in the floating state.

Next, a case in which the select gate line SGD2, that is, the select gate line SGD(4m+2), is selected will be described, mainly focusing on the differences from FIG. 11.

Figure 14:
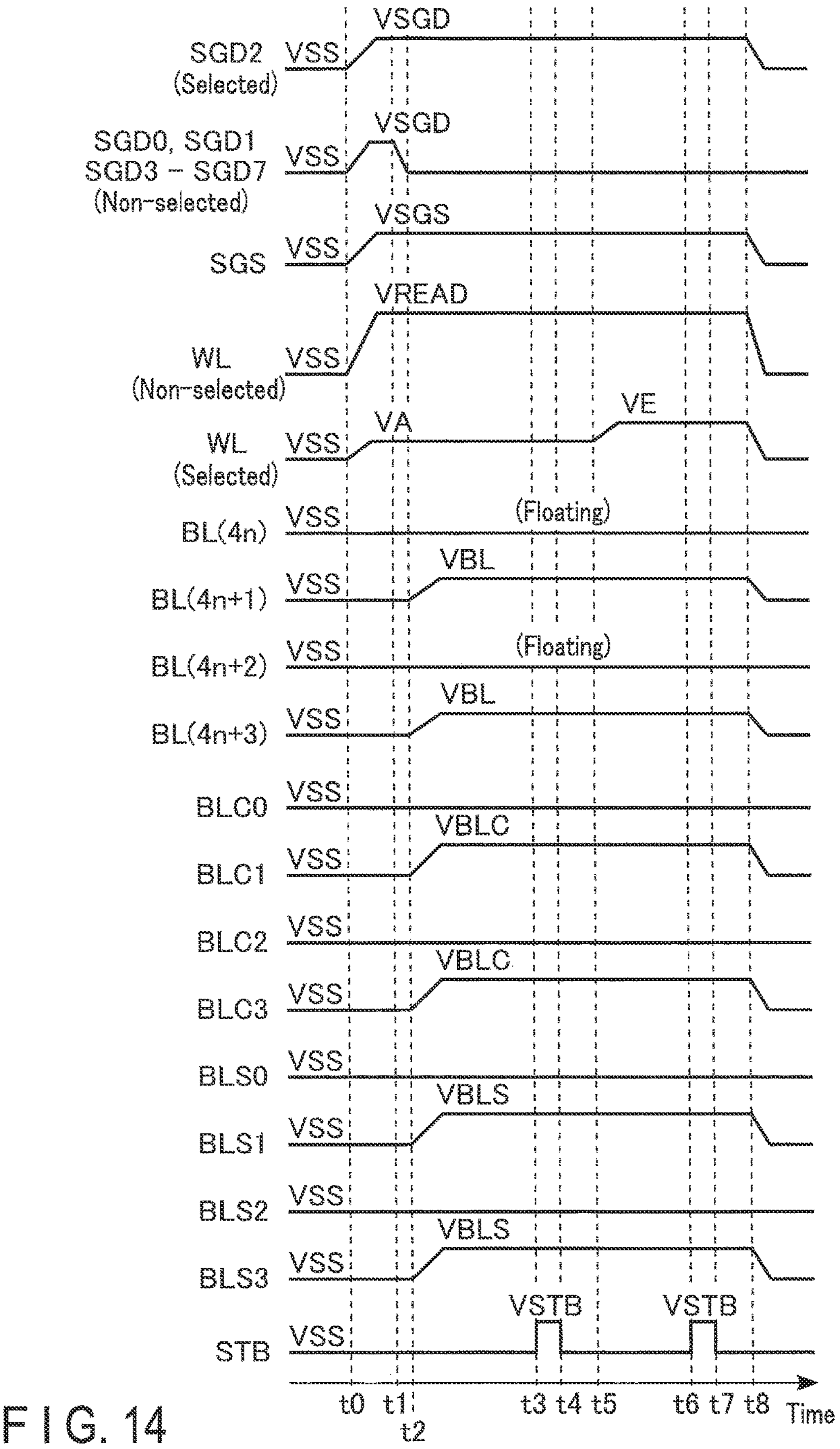
FIG. 14 is a timing chart showing voltages of interconnects during 1-SGD selection read operation according to the first embodiment.

As shown in FIG. 14, the description for the select gate line SGS, the selected word line WL, the non-selected word line WL, and the signal STB is the same as the description with reference to FIG. 11.

First, at time t0, the row decoder 18 applies the voltage VSGD to the select gate line SGD2 that is selected for the 1-SGD selection. Similarly, the row decoder 18 applies the voltage VSGD to the non-selected select gate lines SGD0, SGD1 and SGD3 to SGD7.

At time t1, the row decoder 18 applies a voltage VSS to the non-selected select gate lines SGD0, SGD1 and SGD3 to SGD7.

At time t2, the sequencer 14 sets voltages of the signals BLC1 and BLC3 to the voltage VBLC. The sequencer 14 sets voltages of the signals BLS1 and BLS3 to the voltage VBLS. By this, the voltage VBL is applied to the bit lines BL(4n+1) and BL(4n+3). At this time, the bit lines BL(4n) and BL(4n+2) are in the floating state.

Next, a case in which the select gate line SGD3, that is, the select gate line SGD(4m+3), is selected will be described, mainly focusing on the differences from FIG. 11.

Figure 15:
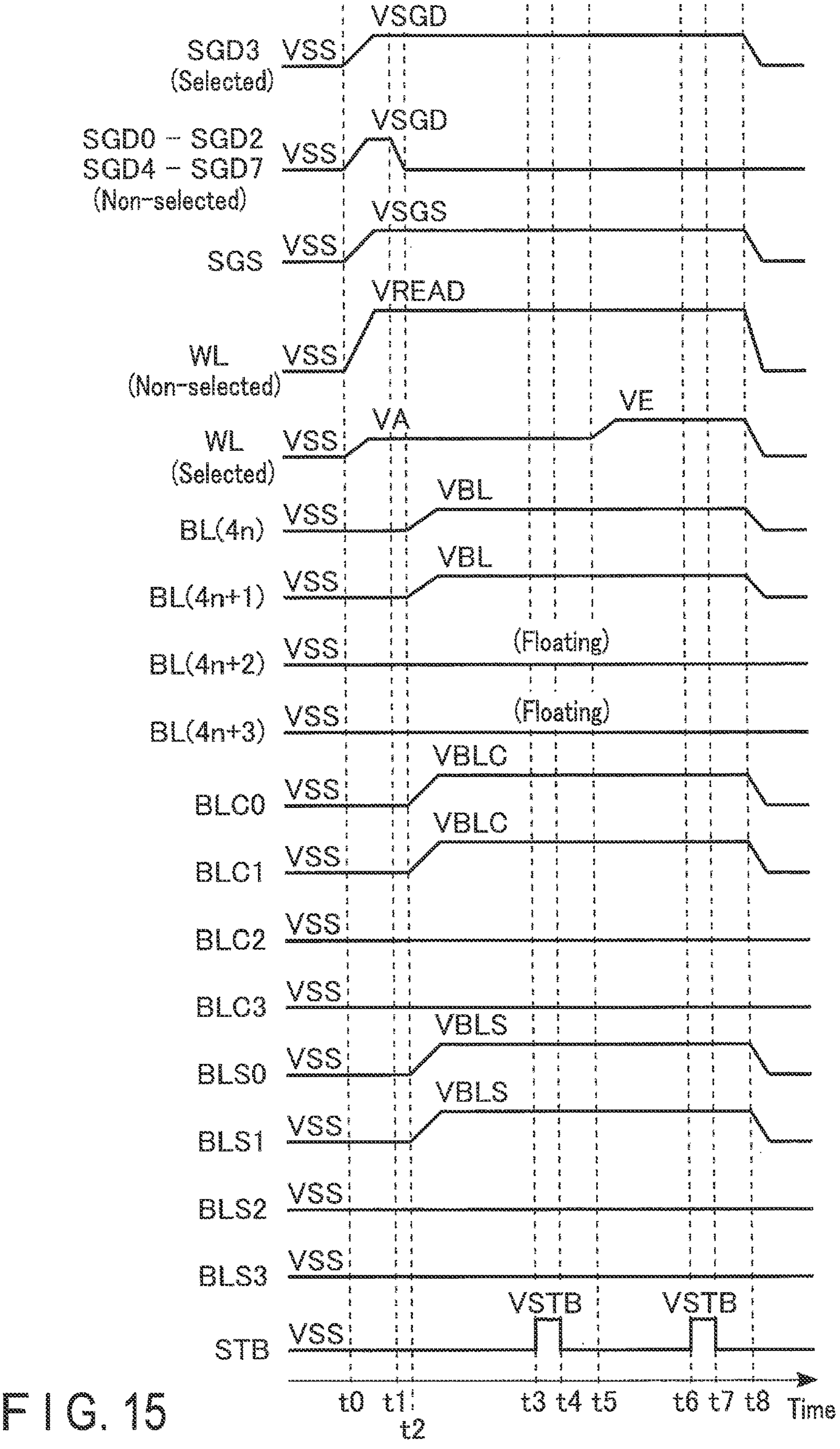
FIG. 15 is a timing chart showing voltages of interconnects during 1-SGD selection read operation according to the first embodiment.

As shown in FIG. 15, the description for the select gate line SGS, the selected word line WL, the non-selected word line WL, and the signal STB is the same as the description with reference to FIG. 11.

First, at time t0, the row decoder 18 applies the voltage VSGD to the select gate line SGD3 that is selected for the 1-SGD selection. Similarly, the row decoder 18 applies the voltage VSGD to the non-selected select gate lines SGD0, SGD2 and SGD4 to SGD7.

At time t1, the row decoder 18 applies a voltage VSS to the non-selected select gate lines SGD0 to SGD2 and SGD4 to SGD7.

At time t2, the sequencer 14 sets voltages of the signals BLC0 and BLC1 to the voltage VBLC. The sequencer 14 sets voltages of the signals BLS0 and BLS1 to the voltage VBLS. By this, the voltage VBL is applied to the bit lines BL(4n) and BL(4n+1). At this time, the bit lines BL(4n+2) and BL(4n+3) are in the floating state.

1.5. Advantageous Effect of Present Embodiment

With the configuration according to the present embodiment, the 1-SGD select operation in which one select gate line SGD is selected or the 2-SGD select operation in which two select gate lines SGD are selected can be selected. Accordingly, a data length during the read operation and the write operation can be selected.

In addition, with the configuration according to the present application, the bit line BL to which the NAND string NS is coupled is different for each string unit SU. Thus, during the 1-SGD select operation, at least one of two bit lines BL adjacent to the selected bit line BL can be set to the non-selected bit line BL. In other words, the bit line BL in the floating state can be arranged adjacent to the selected bit line BL. This can reduce capacitance between interconnects of the bit lines BL. Accordingly, a pre-charge time of the bit lines BL and a time until a voltage of the node SEM becomes stable can be shortened, and a processing rate of the read operation can be improved. A processing capability of the semiconductor memory device can thus be improved.

2. SECOND EMBODIMENT

Next, the second embodiment will be described. In the second embodiment, points different in configuration of the memory cell array 17 from the first embodiment will be mainly described. Hereinafter, the matters different from the first embodiment will be mainly described.

2.1. Configuration

2.1.1 Circuit Configuration of Memory Cell Array

Figure 16:
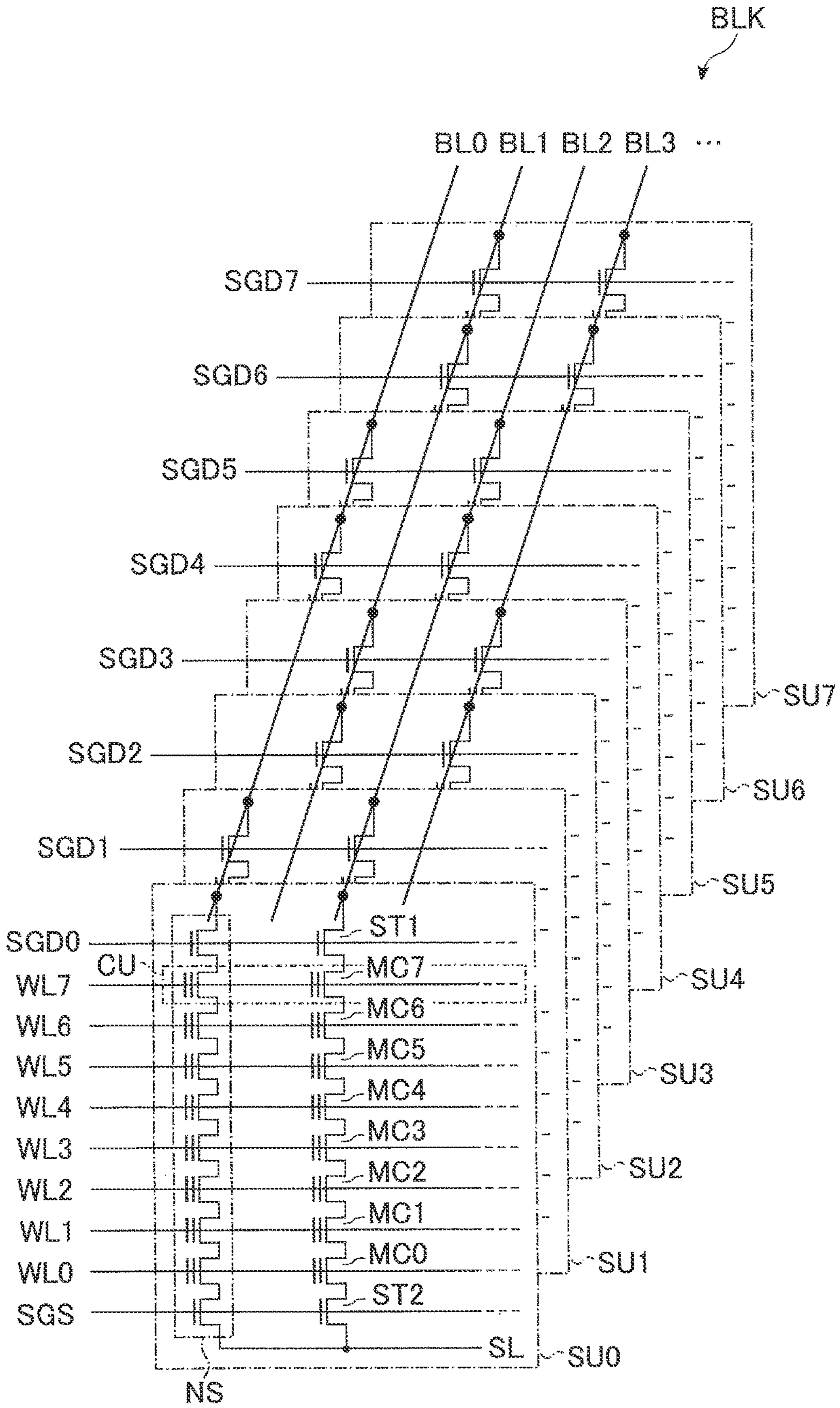
FIG. 16 is a circuit diagram of a memory cell array according to a second embodiment.

First, one example of the circuit configuration of the memory cell array 17 will be described with reference to FIG. 16. FIG. 16 shows a portion of the circuit configuration of a single block BLK.

As shown in FIG. 16, for example, the bit line BL0 is coupled to the NAND string NS in each of the string units SU0, SU1, SU4, and SU5. The bit line BL1 is coupled to the NAND strings NS respectively contained in the string units SU2, SU3, SU6, and SU7. The bit line BL2 is coupled to the NAND string NS respectively contained in the string units SU0, SU1, SU4, and SU5. The bit line BL3 is coupled to the NAND string NS respectively contained in the string units SU2, SU3, SU6, and SU7.

The internal configuration of each NAND string NS is the same as that described with reference to FIG. 2

2.1.2 Coupling between String Unit and Bit Line

Next, one example of coupling between each string unit SU and each bit line BL will be described with reference to FIG. 17. FIG. 17 is a table showing a coupling relationship between the string units SU and the bit lines BL.

As shown in FIG. 17, with respect to four string units SU, coupling and decoupling are periodically repeated for each set of four bit lines BL.

The string units SU(4m) and SU(4m+1) are coupled to the bit lines BL(4n) and BL(4n+2). The string units SU(4m) and SU(4m+1) are decoupled from the bit lines BL(4n+1) and BL(4n+3). In the example shown in FIG. 17, the string units SU0, SU1, SU4, and SU5 are coupled to the bit lines BL0, BL2, and BL4. The string units SU0, SU1, SU4, and SU5 are decoupled from the bit lines BL1 and BL3. That is, the string units SU0, SU1, SU4, and SU5 are coupled to the even-numbered bit lines BL.

The string units SU(4*m*+2) and SU(4*m*+3) are coupled to the bit lines BL(4*n*+1) and BL(4*n*+3). The string units SU(4*m*+2) and SU(4*m*+3) are decoupled from the bit lines BL(4*n*) and BL(4*n*+2). In the example shown in FIG. 17, the string units SU2, SU3, SU6, and SU7 are coupled to the bit lines BL1 and BL3. The string units SU2, SU3, SU6, and SU7 are decoupled from the bit lines BL0, BL2, and BL4. That is, the string units SU2, SU3, SU6, and SU7 are coupled to the odd-numbered bit lines BL.

Figure 18:
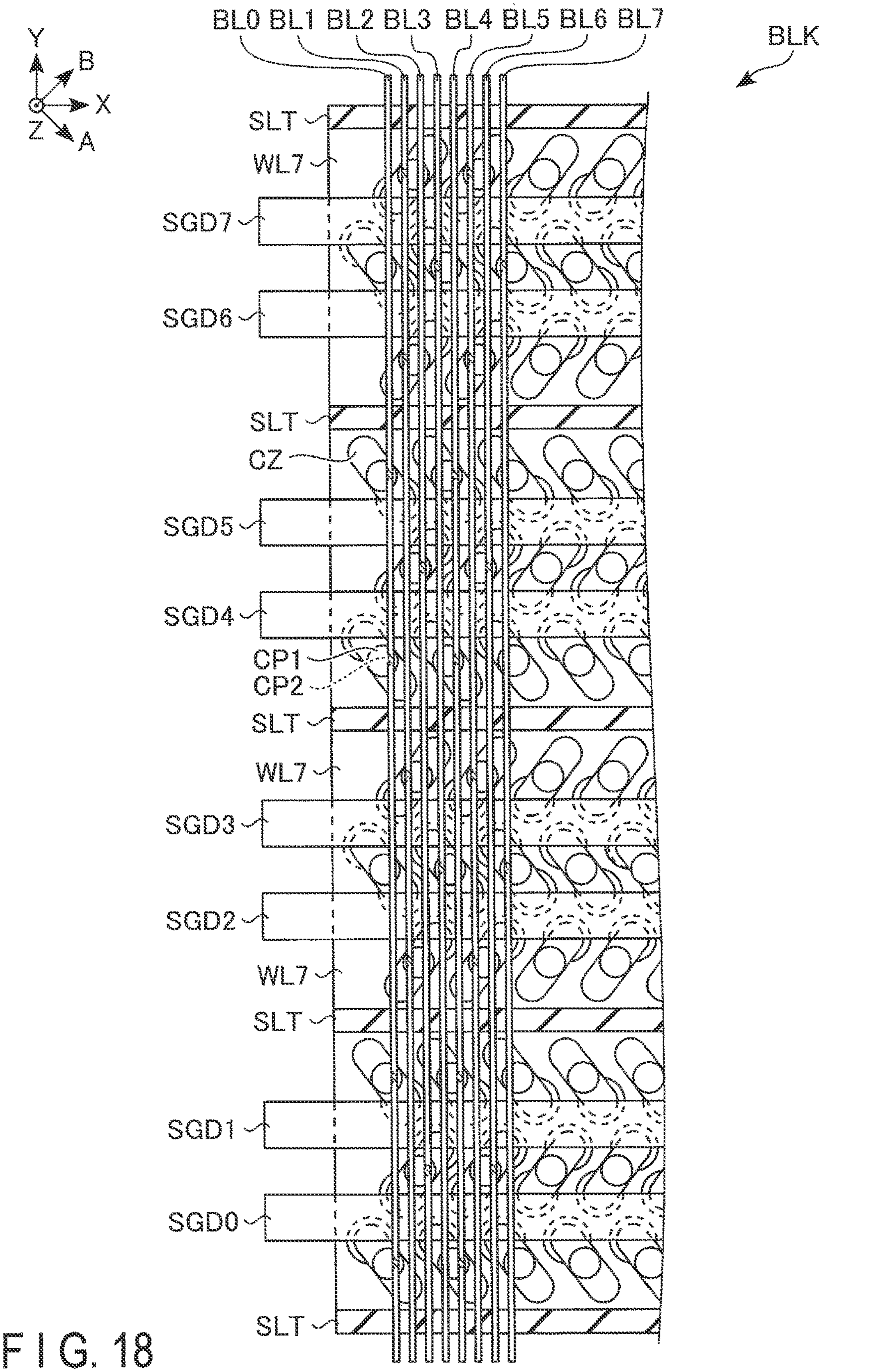
FIG. 18 is a plan view of the memory cell array according to the second embodiment.

2.1.3 Planar Configuration of Memory Cell Array Next, an example of a planer configuration of the memory cell array 17 will be described with reference to FIG. 18. FIG. 18 shows a plan view of a partial region of the memory cell array 17. In the example shown in FIG. 18, some of the insulating layers are omitted in order to simplify the description. Furthermore, the bit lines BL other than the bit lines BL0 to BL7 are omitted.

As shown in FIG. 18, in the present embodiment, the slits SLT are respectively provided in the end in the Y direction of the blocks BLK, between the select gate lines SGD1 and SGD2 between the select gate lines SGD3 and SGD4, and between the select gate lines SGD5 and SGD6. The arrangement of the contact plug CP2 coupled to the bit lines BL0 to BL7 differs from that shown in FIG. 4. The rest of the configuration is the same as that shown in FIG. 4.

2.2 Selection of Select Gate Line and Bit Line During Read Operation and Write Operation Next, one example of selection of the select gate line SGD and the bit line BL during the read operation and the write operation will be described with reference to FIG. 19.

First, the even-numbered select gate lines SGDe will be described. As shown in FIG. 19, during the 1-SGD selection operation, in the case of selecting the select gate line SGD(4*m*), that is, selecting the select gate line SGD0 or SGD4, the bit lines BL(4*n*) and BL(4*n*+2) is selected. More specifically, for example, the bit lines BL0, BL2, BL4, BL6, . . . are selected. Then, the bit lines BL(4*n*+1) and BL(4*n*+3) are not selected. More specifically, for example, the bit lines BL1, BL3, BL5, BL7, . . . are not selected.

During the 1-SGD selection operation, in the case of selecting the select gate line SGD(4*m*+2), that is, selecting the select gate line SGD2 or SGD6, the bit lines BL(4*n*+1) and BL(4*n*+3) are selected. More specifically, for example, the bit lines BL1, BL3, BL5, BL7, . . . are selected. Then, the bit lines BL(4*n*) and BL(4*n*+2) are not selected. More specifically, for example, the bit lines BL0, BL2, BL4, BL6, . . . are not selected.

Next, the odd-numbered select gate lines SGDo will be described.

During the 1-SGD selection operation, in the case of selecting the select gate line SGD(4*m*+1), that is, selecting the select gate line SGD1 or SGD5, the bit lines BL(4*n*) and BL(4*n*+2) are selected. More specifically, for example, the bit lines BL0, BL2, BL4, BL6, . . . are selected. Then, the bit lines BL(4*n*+1) and BL(4*n*+3) are not selected. More specifically, for example, the bit lines BL1, BL3, BL5, BL7, . . . are not selected.

During the 1-SGD selection operation, in the case of selecting the select gate line SGD(4*m*+3), that is, selecting the select gate line SGD3 or SGD7, the bit lines BL(4*n*+1) and BL(4*n*+3) are selected. More specifically, for example, the bit lines BL1, BL3, BL5, BL7, . . . are selected. Then, the bit lines BL(4*n*) and BL(4*n*+2) are not selected. More specifically, for example, the bit lines BL0, BL2, BL4, BL6, . . . are not selected.

As described in the above, in the case of the 1-SGD selection operation, regardless whether the select gate line SGD is even-numbered or odd-numbered, the selected bit lines BL and non-selected bit lines BL are alternately selected for each line. That is, in the configuration of the memory cell array 17, bit lines BL arranged on both sides of a selected bit line BL are not selected. More specifically, for example, in the case of selecting the bit line BL2, the bit lines BL1 and BL3 arranged adjacent to the bit line BL2 are not selected.

2.3 Advantageous Effect of Present Embodiment

The configuration of the present embodiment can attain the same effect as the first embodiment.

3. THIRD EMBODIMENT

Next, the third embodiment will be described. In the third embodiment, points different in configuration of the memory cell array 17 from the first and second embodiments will be mainly described. Hereinafter, the explanation will focus mainly on matters which differ from the first and second embodiments.

3.1. Configuration 3.1.1 Circuit Configuration of Memory Cell Array

Figure 20:
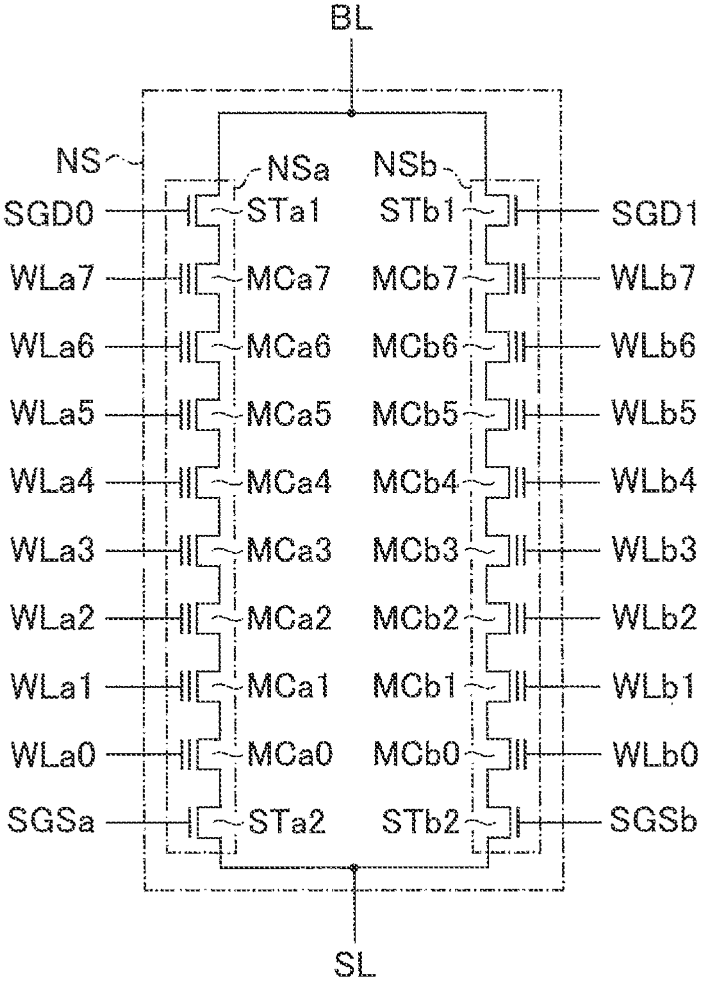
FIG. 20 is a circuit diagram of a NAND string according to a third embodiment.
Figure 21:
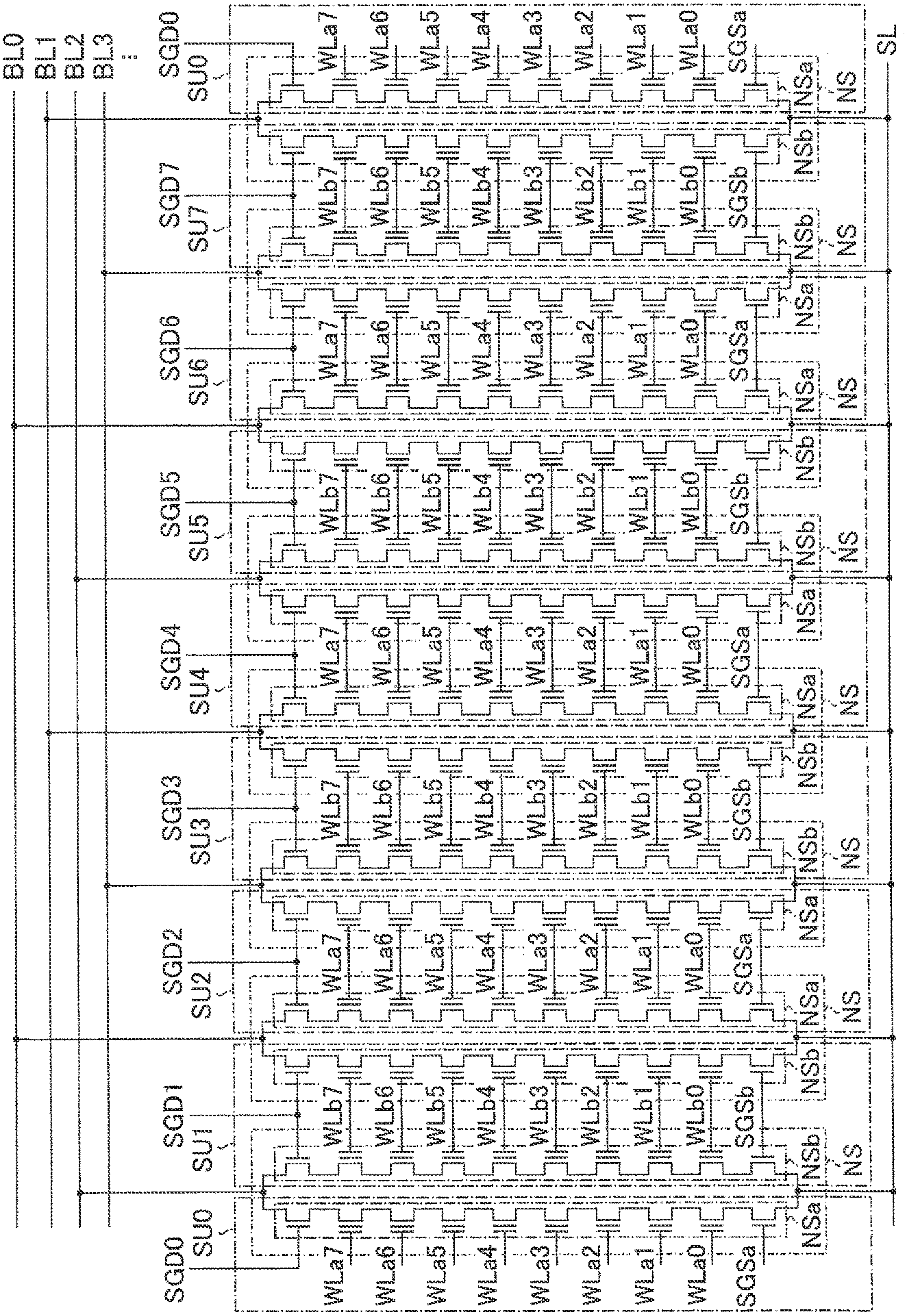
FIG. 21 is a circuit diagram of a memory cell array according to the third embodiment.

First, one example of the circuit configuration of the memory cell array 17 will be described with reference to FIGS. 20 and 21. FIG. 20 is a circuit diagram of the NAND string NS. FIG. 21 shows a portion of the circuit configuration of a single block BLK.

First, the internal configuration of each NAND string NS will be described.

As shown in FIG. 20, the NAND string NS according to the present embodiment includes NAND strings NSa and NSb.

The NAND string NSa includes a plurality of memory cell transistors MCa and selection transistors STa1 and STa2. Similarly, the NAND string NSb includes a plurality of memory cell transistors MCb and selection transistors STb1 and STb2. In the example shown in FIG. 20, the NAND string NSa includes eight memory cell transistors MCa0 to MCa7. The NAND string NSb includes eight memory cell transistors MCb0 to MCb7. Hereinafter, memory cell transistors MCa0 to MCa7 and MCb0 to MCb7 will each be referred to as a memory cell transistor MC when they are not distinguished from each other. The selection transistors STa1 and STb1 will each be referred to as a selection transistor ST1 when they are not distinguished from each other. The selection transistors STa2 and STb2 will each be referred to as a selection transistor ST2 when they are not distinguished from each other.

In each NAND string NSa, the current paths of the memory cell transistors MCa and the selection transistors STa1 and STa2 are coupled in series. More specifically, the current paths of the selection transistor STa2, the memory cell transistors MCa0, MCa1, MCa2, MCa3, MCa4, MCa5, MCa6, and MCa7, and the selection transistor STa1 are coupled in series in order from the lower side to the upper side of the drawing sheet. Similarly, in the NAND string NSb, the current paths of the memory cell transistors MCb and the selection transistors STb1 and STb2 are coupled in series. More specifically, the current paths of the selection transistor STb2, the memory cell transistors MCb0, MCb1, MCb2, MCb3, MCb4, MCb5, MCb6, and MCb7, and the selection transistor STb1 are coupled in series in order from the lower side to the upper side of the drawing sheet.

The drains of selection transistors STa1 and STb1 in the NAND string NS are coupled in common to a single bit line BL. The sources of selection transistors STa2 and STb2 respectively included in the blocks BLK in the NAND string NS are coupled in common to the source line SL.

The memory cell transistors MCa0 to MCa7 included in the same block BLK have their control gates coupled to word lines WLa0 to WLa7, respectively. Similarly, the memory cell transistors MCb0 to MCb7 included in the same block BLK have their control gates coupled to word lines WLb0 to WLb7, respectively.

The NAND strings NSa and NSb in the NAND string NS respectively correspond to the different string units SU. In other words, the NAND strings NSa and NSb are respectively coupled to the different select gate lines SGD. In the example shown in FIG. 20, a select gate line SGD0 is coupled to a gate of the selection transistor STa1. A select gate line SGD1 is coupled to a gate of the selection transistor STb1.

Next, the overall configuration of the memory cell array 17 will be described.

As shown in FIG. 21, the string unit SU0 includes the NAND strings NSa coupled to the select gate line SGD0. The string unit SU1 includes the NAND strings NSb coupled to the select gate line SGD1. The string unit SU2 includes the NAND strings NSa coupled to the select gate line SGD2. The string unit SU3 includes the NAND strings NSb coupled to the select gate line SGD3. The string unit SU4 includes the NAND strings NSa coupled to the select gate line SGD4. The string unit SU5 includes the NAND strings NSb coupled to the select gate line SGD5. The NAND string unit SU6 includes the NAND strings NSa coupled to the select gate line SGD6. The string unit SU7 includes the NAND strings NSb coupled to the select gate line SGD7.

For example, the bit line BL0 is coupled to the NAND string NS including the NSb coupled to the select gate line SGD1 and the NAND string NSa coupled to the select gate line SGD2. The bit line BL0 is coupled to the NAND string NS including the NSb coupled to the select gate line SGD5 and the NAND string NSa coupled to the select gate line SGD6. In other words, the bit line BL0 is coupled to the string units SU1, SU2, SU5, and SU6.

For example, the bit line BL1 is coupled to the NAND string NS including the NSb coupled to the select gate line SGD3 and the NAND string NSa coupled to the select gate line SGD4. The bit line BL1 is coupled to the NAND string NS including the NAND string NSb coupled to the select gate line SGD7 and the NAND string NSa coupled to the select gate line SGD0. In other words, the bit line BL1 is coupled to the string units SU0, SU3, SU4, and SU7.

For example, the bit line BL2 is coupled to the NAND string NS including the NAND string NSa coupled to the select gate line SGD0 and the NAND string NSb coupled to the select gate line SGD1. The bit line BL2 is coupled to the NAND string NS including the NAND string NSa coupled to the select gate line SGD4 and the NAND string NSb coupled to the select gate line SGD5. In other words, the bit line BL2 is coupled to the string units SU0, SU1, SU4, and SU5.

For example, the bit line BL3 is coupled to the NAND string NS including the NAND string NSa coupled to the select gate line SGD2 and the NAND string NSb coupled to the select gate line SGD3. The bit line BL3 is coupled to the NAND string NS including the NAND string NSa coupled to the select gate line SGD6 and the NAND string NSb coupled to the select gate line SGD7. In other words, the bit line BL3 is coupled to the string units SU2, SU3, SU6, and SU7.

3.1.2 Coupling Between String Unit and Bit Line

Next, one example of coupling between the string unit SU and the bit line BL will be described with reference to FIG. 22. FIG. 22 is a table showing a coupling relationship between the string units SU and the bit lines BL.

As shown in FIG. 22, with respect to four string units SU, coupling and decoupling are periodically repeated for each set of four bit lines BL.

The string unit SU(4*m*) is coupled to the bit lines BL(4*n*+1) and BL(4*n*+2). Then, the string unit SU(4*m*) is decoupled from the bit lines BL(4*n*) and BL(4*n*+3). In the example shown in FIG. 22, the string units SU0 and SU4 are coupled to the bit lines BL1 and BL2. The string units SU0 and SU4 are decoupled from the bit lines BL0, BL3, and BL4. In other words, the bit line BL0 is decoupled from the string units SU0 and SU4. For the bit lines BL subsequent to the bit line BL1, the coupling and decoupling are periodically repeated for each set of two bit lines BL, in correspondence with the string units SU0 and SU4.

The string unit SU(4*m*+1) is coupled to the bit lines BL(4*n*) and BL(4*n*+2). The string unit SU(4*m*+1) is decoupled from the bit lines BL(4*n*+1) and BL(4*n*+3). In the example shown in FIG. 22, the string units SU1 and SU5 are coupled to the bit lines BL0, BL2, and BL4. The string units SU1 and SU5 are decoupled from the bit lines BL1 and BL3. That is, the string units SU1 and SU5 are coupled to the even-numbered bit lines BL.

The string unit SU(4*m*+2) is coupled to the bit lines BL(4*n*) and BL(4*n*+3). The string unit SU(4*m*+2) is decoupled from the bit lines BL(4*n*+1) and BL(4*n*+2). In the example shown in FIG. 22, the string units SU2 and SU6 are coupled to the bit lines BL0, BL3, and BL4. The string units SU2 and SU6 are decoupled from the bit lines BL1 and BL2. In other words, the bit line BL0 is coupled to the string units SU2 and SU6. For the bit lines BL subsequent to the bit line BL1, decoupling and coupling are periodically repeated for each set of two bit lines BL, in correspondence with the string units SU2 and SU6.

The string unit SU(4*m*+3) is coupled to the bit lines BL(4*n*+1) and BL(4*n*+3). The string unit SU(4*m*+3) is decoupled from the bit lines BL(4*n*) and BL(4*n*+2). In the example shown in FIG. 22, the string units SU3 and SU7 are coupled to the bit lines BL1 and BL3. The string units SU3 and SU7 are decoupled from the bit lines BL0, BL2, and BL4. That is, the string units SU3 and SU7 are coupled to the odd-numbered bit lines BL.

3.1.3 Planar Configuration of Memory Cell Array

Next, an example of a planer configuration of the memory cell array 17 will be described with reference to FIGS. 23 and 24. FIG. 23 is a planer view of the select gate line SGD. FIG. 24 shows a planar view of word lines WLa7 and WLb7. In the examples shown in FIGS. 23 and 24, some of the insulating layers are omitted in order to simplify the description. Furthermore, the bit lines BL other than the bit lines BL0 to BL7 are omitted.

As shown in FIG. 23, the select gate lines SGD0, SGD1, SGD2, SGD3, SGD4, SGD5, SGD6, SGD7, and SGD0 are arranged in order from the upper side to the lower side of the drawing sheet in the Y direction. The select gate lines SGD0 to SGD7 extend in the X direction.

Two select gate lines SGD that are adjacent to each other in the Y direction are separated from each other with an insulating layer (not shown) intervening therebetween. A region of the insulating layer provided between two select gate lines SGD will be referred to as a memory trench MT. More specifically, the memory trench MT is provided between the select gate line SGD0 and the select gate line SGD1, between the select gate lines SGD1 and the select gate lines SGD2, between the select gate line SGD2 and the select gate line SGD3, between the select gate line SGD3 and the select gate line SGD4, between the select gate line SGD4 and the select gate line SGD5, between the select gate line SGD5 and the select gate line SGD6, between the select gate line SGD6 and the select gate line SGD7, and between the select gate line SGD7 and the select gate line SGD0.

A plurality of memory pillars MP are arranged in, for example, a staggered arrangement, between the plurality of select gate lines SGD. One memory pillar MP corresponds to one NAND string NS. In other words, one memory pillar MP corresponds to a pair of NAND strings NSa and NSb.

For example, in the memory pillar MP provided between the select gate line SGD0 and the select gate line SGD1, a combination of a portion of the select gate line SGD0 and a portion of the memory pillar MP in contact with the select gate line SGD0 forms a selection transistor STa1 of the string unit SU0. Furthermore, a combination of a portion of the select gate line SGD1 and a portion of the memory pillar MP in contact with the select gate line SGD1 forms a selection transistor STb1 of the string unit SU1.

Next, a planar layout of word lines WLa7 and WLb7 will be described. The word lines WLa7 and WLb7 are provided below the select gate line SGD in the Z direction.

As shown in FIG. 24, the word line WLa7 includes an interconnect portion WLa7_0 extending in the Y direction and five interconnect portions WLa7_1 to WLa7_5 extending in the X direction. The word line WLb7 includes an interconnect portion WLb7_0 extending in the Y direction and four interconnect portions WLb7_1 to WLb7_4 extending in the X direction.

Between the interconnect portion WLa7_0 and the interconnect portion WLb7_0 in the X direction, the interconnect portions WLa7_1, WLb7_1, WLa7_2, WLb7_2, WLa7_3, WLb7_3, WLa7_4, WLb7_4, and WLa7_5 are arranged in order in the Y direction from the upper side to the lower side of the drawing sheet. One end of each of the interconnect portions WLa7_1 to WLa7_5 is coupled to the interconnect portion WLa7_0, whereas one end of each of the interconnect portions WLb7_1 to WLb7_4 is coupled to the interconnect portion WLb7_0.

The interconnect portion WLa7_1 is arranged below the select gate line SGD0. The interconnect portion WLb7_1 is arranged below the select gate line SGD1. The interconnect portion WLa7_2 is arranged below the select gate line SGD2. The interconnect portion WLb7_2 is arranged below the select gate line SGD3. The interconnect portion WLa7_3 is arranged below the select gate line SGD4. The interconnect portion WLb7_3 is arranged below the select gate line SGD5. The interconnect portion WLa7_4 is arranged below the select gate line SGD6. The interconnect portion WLb7_4 is arranged below the select gate line SGD7. The interconnect portion WLa7_5 is arranged below the select gate line SGD0.

The word lines WLa7 and WLb7 are separated from one another by the memory trench MT. The memory trench MT separates the other word lines WL and the other select gate lines SGS in a similar manner.

The plurality of memory pillars MP are arranged between the word line WLa7 and the word line WLb7. For example, in the memory pillar MP provided between the word line WLa7 and the word line WLb7, a combination of a portion of the word line WLa7 and a portion of the memory pillar MP in contact with the word line WLa7 forms a memory cell transistor MCa7. Similarly, a combination of a portion of the word line WLb7 and a portion of the memory pillar MP in contact with the word line WLb7 forms the memory cell transistor MCb7.

The contact plug CP1 (not shown) is provided on the memory pillar MP. The contact plug CP2 is provided on the contact plug CP1. A contact plug CP2 couples one of the bit lines BL extending in the Y direction to the contact plug CP1. That is, the memory pillar MP is coupled to one of the bit lines BL via the contact plugs CP1 and CP2.

3.1.4 Cross-Sectional Configuration of Memory Cell Array

Next, an example of a cross-sectional configuration of the memory cell array 17 will be described with reference to FIG. 25. FIG. 25 is a cross-sectional view taken along line B1 to B2 of FIG. 23 and FIG. 24.

As shown in FIG. 25, an insulating layer 101 is provided on a semiconductor substrate 100. The interconnect layer 102 is provided on the insulating layer 101.

The interconnect layer 102 extends in the X direction and the Y direction. The interconnect layer 102 functions as a source line SL.

The insulating layer 103 is provided on the interconnect layer 102.

On the insulating layer 103, the plurality of interconnect layers 104 and interconnect layer 120 and the plurality of insulating layers 105 are alternately stacked one by one on the insulating layer 103. In the example shown in FIG. 25, nine interconnect layers 104 and nine insulating layers 105 are alternately stacked. The interconnect layer 120 is provided above the topmost interconnect layer 104 with the insulating layer 105 intervening therebetween. Furthermore, the insulating layer 105 is provided on the interconnect layer 120. The interconnect layers 104 respectively function as the select gate line SGS and the word lines WL0 to WL7 in order from the lowermost layer. The interconnect layer 120 functions as the select gate line SGD.

The plurality of memory pillars MP are provided in the memory cell array 17. One memory pillar MP corresponds to one NAND string NS. In other words, one memory pillar MP corresponds to NAND strings NSa and NSb. The memory pillars MP each penetrate the interconnect layer 120 and nine interconnect layers 104. The bottom surface of each memory pillar MP reaches the interconnect layer 102.

The memory pillars MP each include a block insulating film 106, a charge storage layer 107, a tunnel insulating film 108, a semiconductor layer 109, a core layer 110, and a capping layer 111. The configuration of the memory pillars MP is similar to that of the first embodiment described with reference to FIG. 5.

The memory trench MT is formed in the memory cell array 17. The memory trench MT penetrates the interconnect layer 120 and nine interconnect layers 104. The bottom surface of the memory trench MT reaches the interconnect layer 102. The memory trench MT extends in the X direction. The memory trench MT separates the interconnect layer 104 and the interconnect layer 120 in contact with the memory pillar MP into two parts in the Y direction. The memory trench MT is filled with an insulating layer 130. For the insulating layer 130, for example, SiO is used.

In the example shown in FIG. 25, nine interconnect layers 104 that come into contact with the right side of the memory pillar MP in the drawing sheet function as the select gate line SGSa and the word lines WLa0 to WLa7 in order from the lowermost layer. Furthermore, nine interconnect layers 104 in contact with the left side of the memory pillar MP in the drawing sheet function as the select gate line SGSb and the word lines WLb0 to WLb7 in order from the lowermost layer. The interconnect layer 120 functions as the select gate lines SGD0, SGD1, SGD2, and SGD3, respectively, in order from the right side of the drawing sheet.

The memory pillars MP in combination with eight interconnect layers 104 respectively functioning as the word lines WLa0 to WLa7 respectively form the memory cell transistors MCa0 to MCa7. Similarly, the memory pillars MP in combination with eight interconnect layers 104 respectively functioning as the word lines WLb0 to WLb7 respectively form the memory cell transistors MCb0 to MCb7. Similarly, the memory pillars MP in combination with the interconnect layer 104 functioning as the select gate line SGSa form the selection transistors STa2. The memory pillars MP in combination with the interconnect layer 104 functioning as the select gate line SGSb form the selection transistors STa2.

The memory pillar MP in combination with the interconnect layer 120 in contact with the right side of the memory pillar MP in the drawing sheet forms the selection transistor STa1. The memory pillar MP in combination with the interconnect layer 120 in contact with the left side of the memory pillar MP in the drawing sheet forms the selection transistor STb1.

An insulating layer 112 is provided above the memory pillars MP and the insulating layers 105.

The conductor 124 functioning as the contact plug CP1 is provided on the memory pillar MP.

A conductor 125 functioning as a contact plug CP2 is provided on the conductor 124.

The interconnect layer 126 is provided on the conductor 125 and the insulating layer 112. The interconnect layer 126 extends in the Y direction. The interconnect layer 126 functions as a bit line BL.

3.2 Selection of Select Gate Line and Bit Line During Read Operation and Write Operation Next, one example of selection of the select gate line SGD and the bit line BL during the read operation and the write operation will be described with reference to FIG. 26.

First, the even-numbered select gate lines SGDe will be described. As shown in FIG. 26, during the 1-SGD selection operation, in the case of selecting the select gate line SGD(4$m$), that is, selecting the select gate line SGD0 or SGD4, the bit lines BL(4$n$+1) and BL(4$n$+2) is selected. More specifically, for example, the bit lines BL1, BL2, BL5, BL6, . . . are selected. Then, the bit lines BL(4$n$) and BL(4$n$+3) are not selected. More specifically, for example, the bit lines BL0, BL3, BL4, BL7, . . . are not selected.

During the 1-SGD selection operation, in the case of selecting the select gate line SGD(4$m$+2), that is, selecting the select gate line SGD2 or SGD6, the bit lines BL(4$n$) and BL(4$n$+3) are selected. More specifically, for example, the bit lines BL0, BL3, BL4, BL7, . . . are selected. Then, the bit lines BL(4$n$+1) and BL(4$n$+2) are not selected. More specifically, for example, the bit lines BL1, BL2, BL5, BL6, . . . are not selected.

As described in the above, during the 1-SGD selection operation, in the case of selecting one of the even-numbered select gate lines SGDe, the selected bit lines BL and non-selected bit lines BL are alternately selected for each set of two lines except for the bit line BL0. That is, in the configuration of the memory cell array 17, in the case where bit lines BL are arranged on both sides of a selected bit line BL, one of two adjacent bit lines BL is not selected. More specifically, for example, in the case of selecting the bit line BL1, the bit line BL0 is not selected, and the bit line BL2 is selected.

Next, the odd-numbered select gate lines SGDo will be described.

During the 1-SGD selection operation, in the case of selecting the select gate line SGD(4$m$+1), that is, selecting the select gate line SGD1 or SGD5, the bit lines BL(4$n$) and BL(4$n$+2) are selected. More specifically, for example, the bit lines BL0, BL2, BL4, BL6, . . . are selected. Then, the bit lines BL(4$n$+1) and BL(4$n$+3) are not selected. More specifically, for example, the bit lines BL1, BL3, BL5, BL7, . . . are not selected.

During the 1-SGD selection operation, in the case of selecting the select gate line SGD(4$m$+3), that is, selecting the select gate line SGD3 or SGD7, the bit lines BL(4$n$+1) and BL(4$n$+3) are selected. More specifically, for example, the bit lines BL1, BL3, BL5, BL7, . . . are selected. Then, the bit lines BL(4$n$) and BL(4$n$+2) are not selected. More specifically, for example, the bit lines BL0, BL2, BL4, BL6, . . . are not selected.

As described in the above, during the 1-SGD selection operation, in the case of selecting one of the odd-numbered select gate lines SGDo, the selected bit lines BL and non-selected bit lines BL are alternately selected for each line. That is, in the configuration of the memory cell array 17, bit lines BL arranged on both sides of a selected bit line BL are not selected. More specifically, for example, in the case of selecting the bit line BL2, the bit lines BL1 and BL3 arranged adjacent to the bit line BL2 are not selected.

3.3 Voltage of Each Interconnect in Read Operation

Next, an example of a voltage of each interconnect during the read operation will be described. Hereinafter, as one example of the read operation, a lower-page read operation will be described. Hereinafter, with reference to FIG. 27 to FIG. 30, a 1-SGD select read operation will be described. The 2SGD select read operation is similar to that of the first embodiment shown in FIG. 11.

First, a case in which the select gate line SGD0, that is, the select gate line SGD(4$m$), is selected will be described, mainly focusing on the differences from the first embodiment shown in FIG. 12.

As shown in FIG. 27, the select gate lines SGD0 to SGD7 and SGS, the selected word line WL, the non-selected word line WL, and the signal STB are the same as those in FIG. 12.

At time t2, the sequencer 14 sets voltages of the signals BLC1 and BLC2 to the voltage VBLC. The sequencer 14 sets voltages of the signals BLS1 and BLS2 to the voltage VBLS. By this, the voltage VBL is applied to the bit lines BL(4$n$+1) and BL(4$n$+2). At this time, since the selection transistor ST1 and the transistor 30 of the sense circuit SA are in the OFF state, the bit lines BL(4$n$) and BL(4$n$+3) are in a floating state.

Next, a case in which the select gate line SGD1, that is, the select gate line SGD(4$m$+1), is selected will be described, mainly focusing on the differences from the first embodiment shown in FIG. 13.

As shown in FIG. 28, at time t2, the sequencer 14 sets voltages of the signals BLC0 and BLC2 to the voltage VBLC. The sequencer 14 sets voltages of the signals BLS0 and BLS2 to the voltage VBLS. By this, the voltage VBL is applied to the bit lines BL(4*n*) and BL(4*n*+2). At this time, the bit lines BL(4*n*+1) and BL(4*n*+3) are in the floating state.

Next, a case in which the select gate line SGD2, that is, the select gate line SGD(4*m*+2), is selected will be described, mainly focusing on the differences from the first embodiment shown in FIG. 14.

Figure 29:
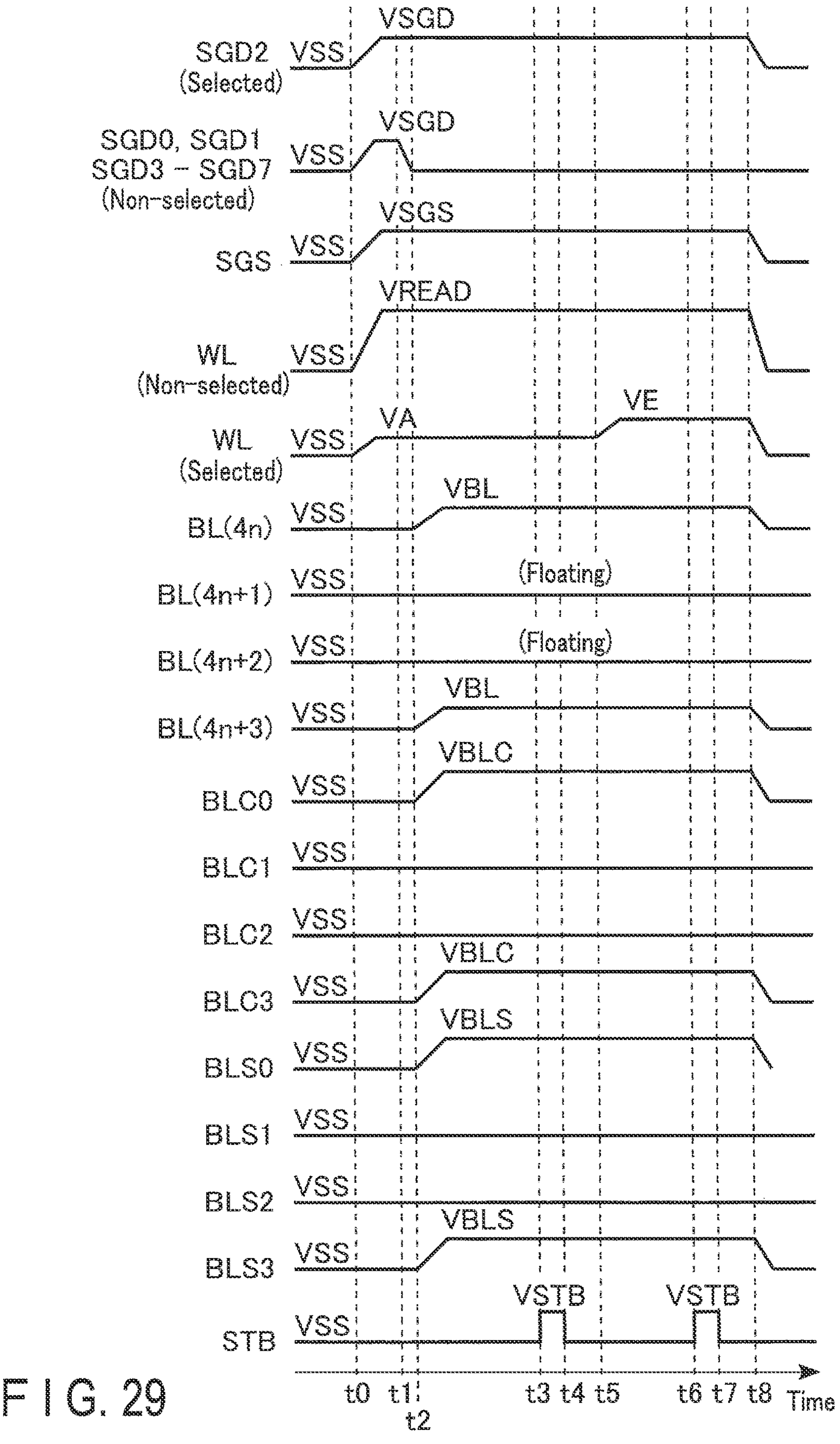
FIG. 29 is a timing chart showing voltages of interconnects during 1-SGD selection read operation according to the third embodiment.

As shown in FIG. 29, at time t2, the sequencer 14 sets voltages of the signals BLC0 and BLC3 to the voltage VBLC. The sequencer 14 sets voltages of the signals BLS0 and BLS3 to the voltage VBLS. By this, the voltage VBL is applied to the bit lines BL(4*n*) and BL(4*n*+3). At this time, the bit lines BL(4*n*+1) and BL(4*n*+2) are in the floating state.

Next, a case in which the select gate line SGD3, that is, the select gate line SGD(4*m*+3), is selected will be described, mainly focusing on the differences from FIG. 15.

Figure 30:
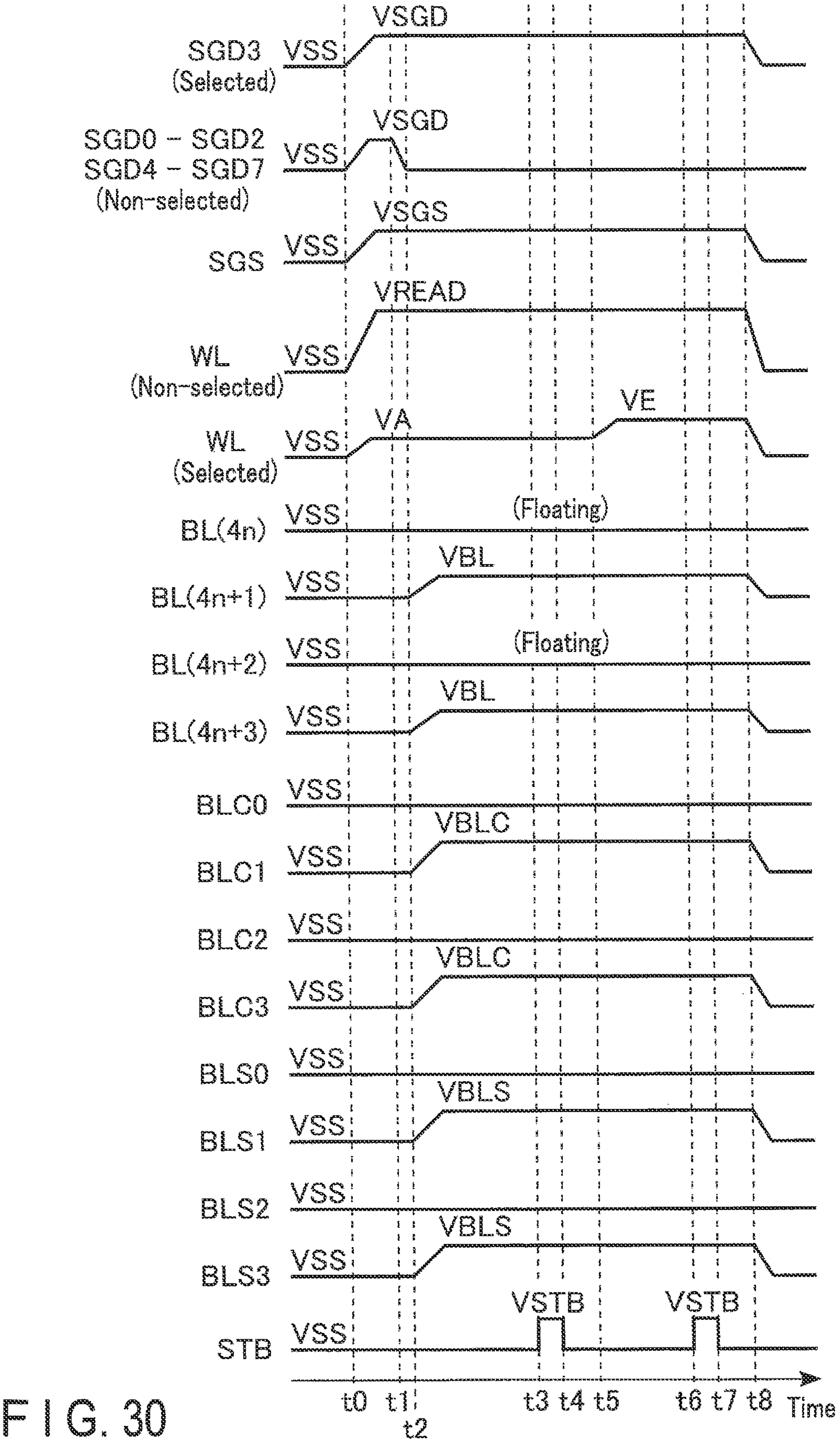
FIG. 30 is a timing chart showing voltages of interconnects during 1-SGD selection read operation according to the third embodiment.

As shown in FIG. 30, at time t2, the sequencer 14 sets voltages of the signals BLC1 and BLC3 to the voltage VBLC. The sequencer 14 sets voltages of the signals BLS1 and BLS3 to the voltage VBLS. By this, the voltage VBL is applied to the bit lines BL(4*n*+1) and BL(4*n*+3). At this time, the bit lines BL(4*n*) and BL(4*n*+2) are in the floating state.

3.4 Advantageous Effect of Present Embodiment

The configuration of the present embodiment can attain the same effect as the first embodiment.

4. MODIFICATION, ETC.

A semiconductor memory device according to above embodiments includes: a first string unit (SU0) including a first memory string (NS) including a first selection transistor (ST1) and a first memory cell (MC7) coupled to the first selection transistor; a second string unit (SU2) including a second memory string (NS) including a second selection transistor (ST1) and a second memory cell (MC7) coupled to the second selection transistor; a first select gate line (SGD0) that is coupled to the first selection transistor; a second select gate line (SGD2) that is coupled to the second selection transistor and is different from the first select gate line; a first bit line (BL0) that is coupled to the first string unit and is not coupled to the second string unit; a second bit line (BL1) that is coupled to the second string unit and is not coupled to the first string unit; and a first word line that is coupled to the first memory cell and the second memory cell. Both of the first select gate line and the second select gate line are selected in a first read operation. The first select gate line is selected and the second select gate line is not selected in a second read operation.

By applying the above embodiments, it is possible to provide a semiconductor memory device that can improve its processing capability.

The embodiments are not limited to those described in the above, and various modifications can be made.

The state of being "coupled" in the foregoing embodiments includes a state of being coupled with something else such as a transistor or a resistor indirectly intervening.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:

a first string unit including a first memory string including a first selection transistor and a first memory cell coupled to the first selection transistor;

a second string unit including a second memory string including a second selection transistor and a second memory cell coupled to the second selection transistor;

a first select gate line that is coupled to the first selection transistor;

a second select gate line that is coupled to the second selection transistor and is different from the first select gate line;

a first bit line that is coupled to the first string unit and is not coupled to the second string unit;

a second bit line that is coupled to the second string unit and is not coupled to the first string unit; and a first word line that is coupled to the first memory cell and the second memory cell, wherein both of the first select gate line and the second select gate line are selected in a first read operation, and the first select gate line is selected and the second select gate line is not selected in a second read operation.

2. The semiconductor memory device according to claim 1, wherein a first voltage is applied to the first bit line and the second bit line in the first read operation, and the first voltage is applied to the first bit line and the second bit line is turned to a floating state in the second read operation.

3. The semiconductor memory device according to claim 2, wherein a second voltage higher than the first voltage is applied to the first select gate line and the second select gate line in the first read operation, and the second voltage is applied to the first select gate line and a third voltage lower than the first voltage is applied to the second select gate line in the second read operation.

4. The semiconductor memory device according to claim 1, further comprising:

a first sense amplifier unit coupled to the first bit line; and a second sense amplifier unit coupled to the second bit line, wherein a first sense amplifier unit includes a first transistor coupled to the first bit line, a second sense amplifier unit includes a second transistor coupled to the second bit line, the first transistor and the second transistor are turned to an ON state in the first read operation, and the first transistor is turned to the ON state and the second transistor is turned to an OFF state in the second read operation.

5. The semiconductor memory device according to claim 1, wherein the first selection transistor and the second selection transistor are turned to an ON state in the first read operation, and the first selection transistor is turned to the ON state and the second selection transistor is turned to an OFF state in the second read operation.

6. The semiconductor memory device according to claim 1, wherein the first bit line and the second bit line are arranged adjacent to each other.

7. The semiconductor memory device according to claim 1, wherein a data length of read data in the first read operation is larger than a data length of read data in the second read operation.

8. The semiconductor memory device according to claim 1, further comprising:
- a third string unit including a third memory string including a third selection transistor and a third memory cell coupled to the third selection transistor; and
- a third select gate line that is coupled to the third selection transistor and is different from the first select gate line and the second select gate line,
- wherein the third memory cell is coupled to the first word line, and
- the second selection transistor and the third selection transistor are coupled to the second bit line.

9. The semiconductor memory device according to claim 1, further comprising:
- a third string unit including a third memory string including a third selection transistor and a third memory cell coupled to the third selection transistor;
- a fourth string unit including a fourth memory string including a fourth selection transistor and a fourth memory cell coupled to the fourth selection transistor;
- a third select gate line that is coupled to the third selection transistor and is different from the first select gate line and the second select gate line; and
- a fourth select gate line that is coupled to the fourth selection transistor and is different from the first select gate line, the second select gate line, and the third select gate line,
- wherein the third memory cell and the fourth memory cell are coupled to the first word line,
- the third string unit is coupled to the first bit line and the second bit line, and
- the fourth string unit is not coupled to the first bit line and the second bit line.

10. The semiconductor memory device according to claim 9, wherein the first select gate line and the fourth select gate line are arranged adjacent to each other,
- the fourth select gate line and the second select gate line are arranged adjacent to each other, and
- the second select gate line and the third select gate line are arranged adjacent to each other.

11. The semiconductor memory device according to claim 9, further comprising:
- a third bit line coupled to the first string unit and the fourth string unit; and
- a fourth bit line coupled to the second string unit and the fourth string unit.

12. The semiconductor memory device according to claim 11, wherein the third bit line and the fourth bit line are arranged adjacent to each other.

13. The semiconductor memory device according to claim 11, wherein the first bit line and the second bit line are arranged adjacent to each other,
- the second bit line and the third bit line are arranged adjacent to each other, and
- the third bit line and the fourth bit line are arranged adjacent to each other.

14. The semiconductor memory device according to claim 11, wherein the first select gate line and the fourth select gate line are arranged adjacent to each other,
- the fourth select gate line and the second select gate line are arranged adjacent to each other, and
- the second select gate line and the third select gate line are adjacent to each other.

15. The semiconductor memory device according to claim 9, wherein the third select gate line and the fourth select gate line are not selected in the first read operation and the second read operation.

16. The semiconductor memory device according to claim 1, further comprising:
- a third string unit including a third memory string including a third selection transistor and a third memory cell coupled to the third selection transistor;
- a fourth string unit including a fourth memory string including a fourth selection transistor and a fourth memory cell coupled to the fourth selection transistor;
- a third select gate line that is coupled to the third selection transistor and is different from the first select gate line and the second select gate line; and
- a fourth select gate line that is coupled to the fourth selection transistor and is different from the first select gate line, the second select gate line, and the third select gate line,
- wherein the third memory cell and the fourth memory cell are couple to the first word line,
- the third string unit is not coupled to the first bit line and is coupled to the second bit line, and
- the fourth string unit is coupled to the first bit line and is not coupled to the second bit line.

17. The semiconductor memory device according to claim 16, further comprising:
- a third bit line coupled to the first string unit and the fourth string unit; and
- a fourth bit line coupled to the second string unit and the third string unit.

18. The semiconductor memory device according to claim 1, further comprising:
- a third string unit including a third memory string including a third selection transistor and a third memory cell coupled to the third selection transistor;
- a third select gate line that is coupled to a gate of the third selection transistor and is different from the first select gate line and the second select gate line; and
- a second word line that is coupled to the third memory cell and is arranged adjacent to the first word line,
- wherein the second selection transistor and the third selection transistor are coupled to the second bit line.

19. The semiconductor memory device according to claim 1, further comprising:
- a third string unit including a third memory string including a third selection transistor and a third memory cell coupled to the third selection transistor;
- a fourth string unit including a fourth memory string including a fourth selection transistor and a fourth memory cell coupled to the fourth selection transistor;
- a third select gate line that is coupled to the third selection transistor and is different from the first select gate line and the second select gate line; and
- a fourth select gate line that is coupled to the fourth selection transistor and is different from the first select gate line, the second select gate line, and the third select gate line,
- wherein the third memory cell and the fourth memory cell are coupled to a second word line arranged adjacent to the first word line,
- the third string unit is not coupled to the first bit line and is coupled to the second bit line, and
- the fourth string unit is coupled to the first bit line and is not coupled to the second bit line.

20. The semiconductor memory device according to claim 19, further comprising:

a third bit line coupled to the second string unit and the fourth string unit; and a fourth bit line coupled to the first string unit and the third string unit.

* * * * *